(12) United States Patent
Hase

(10) Patent No.: US 7,883,983 B2
(45) Date of Patent: Feb. 8, 2011

(54) SEMICONDUCTOR DEVICE AND METHOD OF MANUFACTURING THE SAME

(75) Inventor: Takashi Hase, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 75 days.

(21) Appl. No.: 12/467,519

(22) Filed: May 18, 2009

(65) Prior Publication Data

US 2009/0286378 A1 Nov. 19, 2009

(30) Foreign Application Priority Data

May 19, 2008 (JP) .............................. 2008-131168

(51) Int. Cl.
*H01L 21/768* (2006.01)

(52) U.S. Cl. .............................. 438/385; 257/E21.006; 257/E27.016

(58) Field of Classification Search ................. 438/210, 438/238, 385, FOR. 207, FOR. 429
See application file for complete search history.

(56) References Cited

U.S. PATENT DOCUMENTS

2008/0246073 A1* 10/2008 Lee et al. .................... 257/314

2010/0099229 A1* 4/2010 Chiu et al. .................. 438/238

FOREIGN PATENT DOCUMENTS

JP 2000-307060 11/2000
JP 2001-351877 12/2001

* cited by examiner

*Primary Examiner*—George Fourson
(74) *Attorney, Agent, or Firm*—Young & Thompson

(57) ABSTRACT

A method of manufacturing a semiconductor device, includes: forming a gate insulating film on a semiconductor substrate; forming a first metal film on the gate insulating film; forming a second metal film on the first metal film; and patterning a stacked film of the first and second metal films such that the stacked film is left in a gate electrode formation region and a resistive element formation region. The method further includes: removing the second metal film in the resistive element formation region with protecting a contact hole formation region. The method further includes: forming an interlayer insulating film so as to cover the stacked film; and removing the interlayer insulating film formed in the contact hole formation region to form a contact hole leading to the second metal film.

12 Claims, 27 Drawing Sheets

Fig. 9
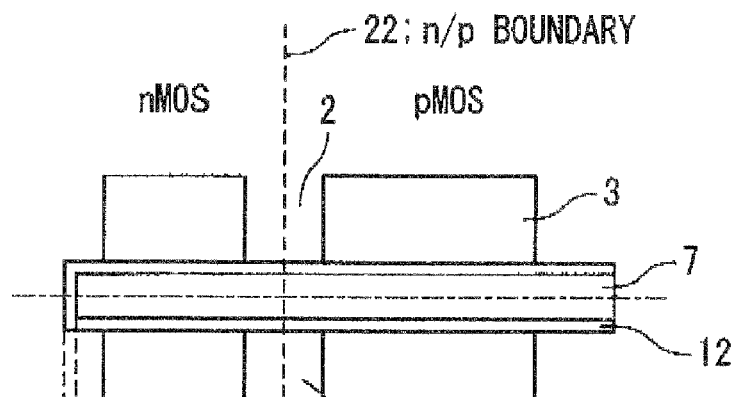
(a)
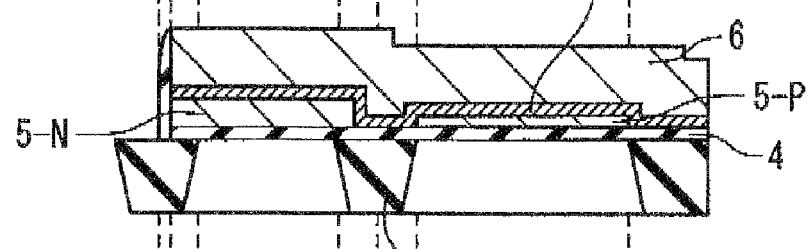
(b)
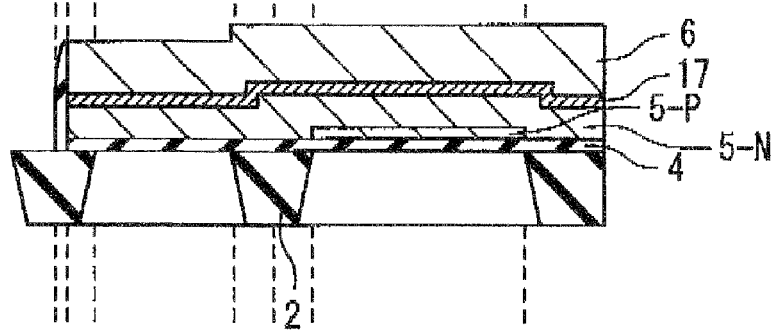
(c)

SEMICONDUCTOR DEVICE AND METHOD OF MANUFACTURING THE SAME

INCORPORATION BY REFERENCE

This application is based upon and claims the benefit of priority from Japanese patent application No. 2008-131168, filed on May 19, 2008, the disclosure of which is incorporated herein in its entirely by reference.

BACKGROUND OF THE INVENTION

1. Field of the Invention

The present invention relates to a semiconductor device and a method of manufacturing the same. In particular, the present invention relates to a semiconductor device that uses a metal film as a gate electrode and a resistive element, and a method of manufacturing the same.

2. Description of Related Art

In a semiconductor device, a gate electrode is formed on a substrate. To use a metal electrode as the gate electrode is considered in order to prevent carrier depletion of the gate electrode at the gate/dielectric interface and to reduce resistance of the gate electrode. Also, a resistive element as well as the gate electrode is sometimes formed on the substrate. Material of the resistive element may be polysilicon.

If polysilicon is used fox both of the gate electrode and the resistive element, the gate electrode and the resistive element can be formed at the same time. However, in a case where a metal electrode is used as the gate electrode while polysilicon is used for the resistive element, the gate electrode and the resistive element cannot be formed by the same process, which complicates fabrication processes.

Japanese Laid-Open Patent Application JP-2001-351877 discloses a related technique, FIG. 1 is a cross-sectional view of a semiconductor device according to the related technique. As shown in FIG. 1, a gate electrode and a resistive element are formed on a substrate. The gate electrode consists of a lower layer gate electrode and an upper layer gate electrode. The resistive element and the lower layer gate electrode are formed of the same material, which suppresses increase in the number of fabrication processes.

Japanese Laid-Open Patent Application JP-2000-307060 discloses another related technique. According to the related technique, a polysilicon film that is a material film of a resistive element is covered by refractory metal silicide, and then the refractory metal silicide is left unremoved only on a connection point of the resistive element. As a result, excessive etching can be suppressed when forming a contact.

The inventor of the present application has recognized the following points. Let us consider a case where a metal electrode is used as a gate electrode. In this case, it may be considered to use the same metal film not only for the gate electrode but also for a resistive element in order to simplify the fabrication processes. However, the metal film has higher conductivity as compared with a polysilicon film. Thus, a film thickness of the resistive element has to be made smaller as compared with a case when a polysilicon film is used, in order to achieve a desired resistance value by the resistive element.

Note here that an upper layer wiring is connected to the resistive element through a contact hole. It is necessary for forming the contact hole to etch a film covering the resistive element. However, when the film thickness of the resistive element is small, the resistive element is also removed by the etching for forming the contact hole.

SUMMARY

In an aspect of the present invention, a method of manufacturing a semiconductor device is provided. The method includes: forming a gate insulating film on a substrate; forming a first metal film on the gate insulating film; forming a second metal film on the first metal film; patterning a stacked film of the first and second metal films such that the stacked film is left in a gate electrode formation region and a resistive element formation region, wherein a gate electrode of a transistor is formed in the gate electrode formation region and a resistive element section is formed in the resistive element formation region; setting a contact hole formation region within each of the gate electrode formation region and the resistive element formation region; removing the second metal film in the resistive element formation region with protecting the contact hole formation region; forming an interlayer insulating film so as to cover the stacked film, after the removing the second metal film; and removing the interlayer insulating film formed in the contact hole formation region to form a contact hole leading to the second metal film in said contact hole formation region.

According to the present invention, the gate electrode is formed of the metal film. Moreover, a substantive film thickness of the resistive element section can be suppressed to a thickness of the first metal film, due to the above-described process of removing the second metal film. It is therefore possible to achieve a desired resistance value by the resistive element section, although the metal film is used as the resistive element section.

Furthermore, the second metal film is left on the first metal film in the contact hole formation region. That is to say, a sufficient thickness (first metal film+second metal film) is retained for the resistive element section in the contact hole formation region. Therefore, in the process of forming the contact hole, the formed contact hole is prevented from penetrating through the resistive element section.

In another aspect of the present invention, a semiconductor device is provided. The semiconductor device is provided with: a gate electrode formed in a transistor formation region on a substrate; a resistive element section formed in a resistive element formation region on the substrate; an interlayer insulating film so formed as to cover the gate electrode and the resistive element section; and a contact hole so formed as to penetrate through the interlayer insulating film to reach the resistive element section. Each of the gate electrode and the resistive element section includes a first metal film and a second metal film formed on the first metal film. The resistive element formation region includes: a first region in which only the first metal film is formed; and a second region in which both of the first and second metal films are formed. In the resistive element formation region, the contact hole is formed in the second region.

According to the present invention, it is possible, when forming the contact hole for connecting between the resistive element and the upper layer wiring, to prevent the contact hole from penetrating through the resistive element even if the film thickness of the resistive element is small.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is an explanatory diagram for explaining the fourth example; and

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

(Structure)

Figure 1:
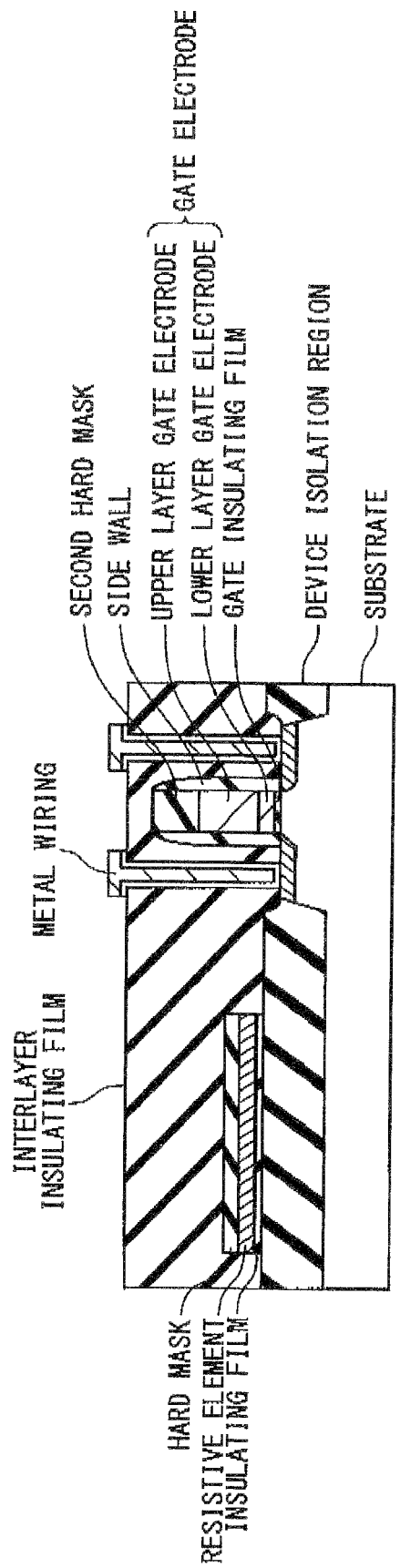
FIG. 1 is a cross-sectional view showing a semiconductor device according to a related technique.
Figure 2:
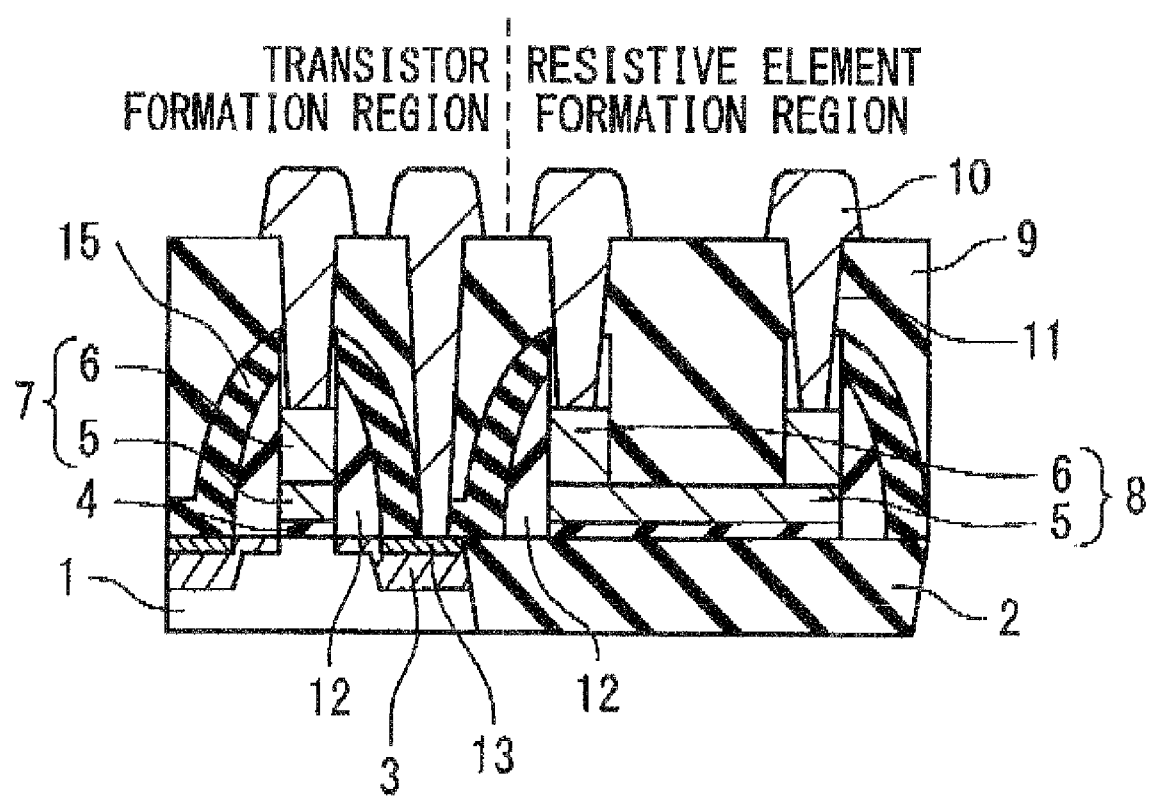
FIG. 2 is a cross-sectional view showing a semiconductor device according to an embodiment of the present invention.

FIG. 2 is a cross-sectional view showing a semiconductor device according to an embodiment of the present invention. The semiconductor device has a semiconductor substrate 1. A transistor formation region in which a transistor is formed and a resistive element formation region in which a resistive element section is formed are provided on the semiconductor substrate 1.

In the transistor formation region, source/drain regions 3, a gate insulating film 4 and a gate electrode 7 are formed. The semiconductor substrate 1, the source/drain regions 3, the gate insulating film 4 and the gate electrode 7 constitute the transistor.

The gate electrode 7 is formed over the semiconductor substrate 1 through the gate insulating film 4. The gate electrode 7 includes: a first metal film 5 that is in contact with the gate insulating film 4; and a second metal film 6 formed on the first metal film 5. That is to say, the gate electrode 7 has two-layer structure. Side walls 12 such as silicon nitride films are formed on both sides of the gate electrode 7. A stopper nitride film 15 (stress liner film 15) is formed on the side wall 12.

The source/drain regions 3 are formed in the surface section of the semiconductor substrate 1. The source/drain regions 3 are so provided as to sandwich a region on which the gate electrode 7 is provided. A silicide layer 13 is formed on the source/drain region 3.

On the other hand, in the resistive element formation region, a device isolation region 2 (STI: Shallow Trench Isolation) is formed on the semiconductor substrate 1. A resistive element section 8 is formed on the device isolation region 2 through an insulating film that is the same as the gate insulating film 4. As in the case of the gate electrode 7, the resistive element section 8 includes the first metal film 5 and the second metal film 6. Note here that the second metal film 6 is provided only on a part of the first metal film 5 in the resistive element formation region. That is, the resistive element formation region includes: a first region in which only the first metal film 5 is formed; and a second region in which both of the first metal film 5 and the second metal film 6 are formed. As in the case of the gate electrode 7, side walls 12 are formed on both sides of the resistive element section 8, and the stopper nitride film 15 (stress liner film 15) is formed on the side wall 12.

The transistor section and the resistive element section 8 are covered by an interlayer insulating film 9. A wiring layer 10 is formed on the interlayer insulating film 9. A plurality of contact holes 11 (a group of contact holes 11) is formed in the interlayer insulating film 9. More specifically, a contact hole 11 connecting between the gate electrode 7 and the wiring layer 10, a contact hole 11 connecting between the silicide layer 13 and the wiring layer 10 and a contact hole 11 connecting between the resistive element section 8 and the wiring layer 10 are formed to penetrate through the interlayer insulating film 9. In the resistive element formation region, the contact hole 11 is formed in the above-mentioned second region, i.e., the contact hole 11 penetrates the interlayer insulating film 9 to reach a position where the second metal film 6 of the resistive element section 8 exists.

According to the semiconductor device thus constructed, the resistance value of the gate electrode 7 can be made lower, since the metal film is used as the gate electrode 7. Moreover, the resistive element section 8 is substantially formed of the first metal film 5, although the second metal film 6 is partially provided in the resistive element formation region. By thinning the first metal film 5, it is possible to achieve a resistance value required for the resistive element section 8.

It should be noted that the "metal film" in this specification means a "conductive film having metallic conductivity". For example, nitride such as TiN, TaN and TaSiN, oxide such as $RuO_2$ and carbide such as TaC have the metallic conductivity and are included in the "metal film". On the other hand, Si (may include impurities), Ge and the like have conductivity of semiconductor-type and are not included in the "metal film".

As described above, the semiconductor device according to the present invention comprises: a gate electrode formed in a transistor formation region on a substrate; a resistive element section formed in a resistive element formation region on the substrate; an interlayer insulating film so formed as to cover the gate electrode and the resistive element section; and a contact hole so formed as to penetrate through the interlayer insulating film to reach the resistive element section. Each of the gate electrode and the resistive element section includes a first metal film and a second metal film formed on the first metal film. The resistive element formation region includes: a first region in which only the first metal film is formed; and a second region in which both of the first and second metal films are formed. In the resistive element formation region, the contact hole is formed in the second region.

In the semiconductor device, a conductive etching sacrifice layer may be formed between the first metal film and the second metal film.

The first metal film may be a TaSiN film. The second metal film may be a W film.

(Manufacturing Method)

A method of manufacturing the semiconductor device according to the present embodiment will be described below.

FIGS. 3A to 3G are cross-sectional views showing manufacturing processes of the semiconductor device according to the present embodiment.

Figure 3A:
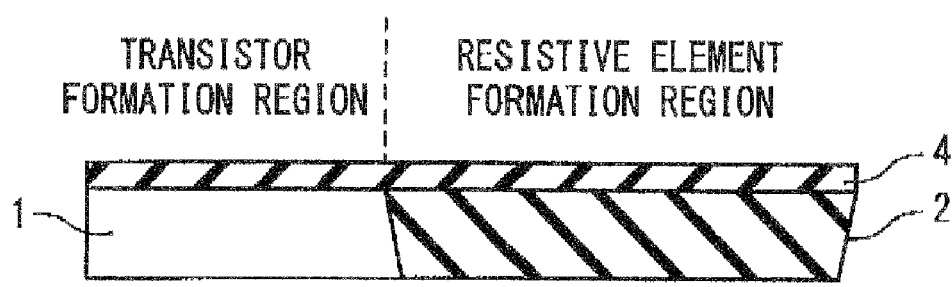
FIGS. 3A to 3G are cross-sectional views showing manufacturing processes of the semiconductor device according to the embodiment of the present invention.

First, as shown in FIG. 3A, the device isolation region 2 is formed on the semiconductor substrate 1 around the transistor formation region. Further, the gate insulating film 4 is formed on the semiconductor substrate 1.

Figure 3B:
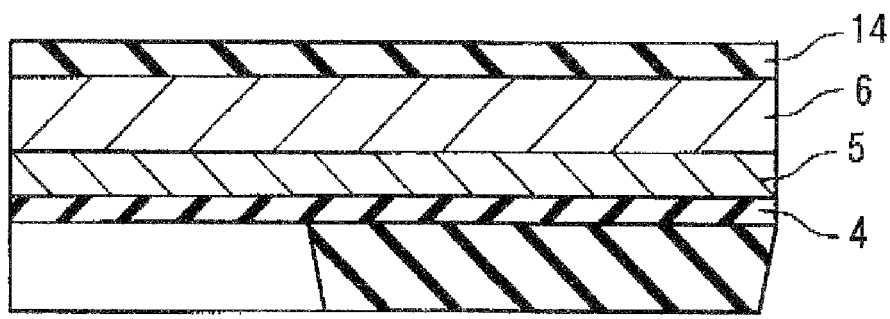

Next, as shown in FIG. 3B, the first metal film 5, the second metal film 6 and a hard mask 14 are deposited in this order on the gate insulating film 4.

Figure 3C:
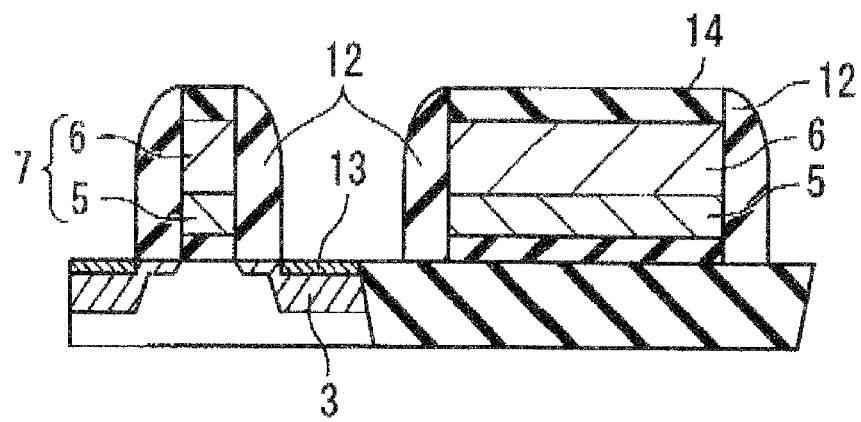

Next, as shown in FIG. 3C, the first metal film 5 and the second metal film 6 are etched (patterned) with a gate electrode formation region and a resistive element formation region masked by the hard mask 14. Here, the gate electrode formation region is a region in which the gate electrode 7 is scheduled to be formed, and the resistive element formation region is a region in which the resistive element section 8 is scheduled to be formed. After that, a transistor section is formed in accordance with a well-known MOS (Metal Oxide Semiconductor) transistor fabrication process with the hard mask 14 left, and thereby the source/drain region 3, the silicide layer 13 and the side wall 12 are formed. When the silicide layer 13 is formed on the source/drain region 3, the silicide is not formed in the gate electrode formation region and the resistive element formation region due to the hard mask 14.

Figure 3D:
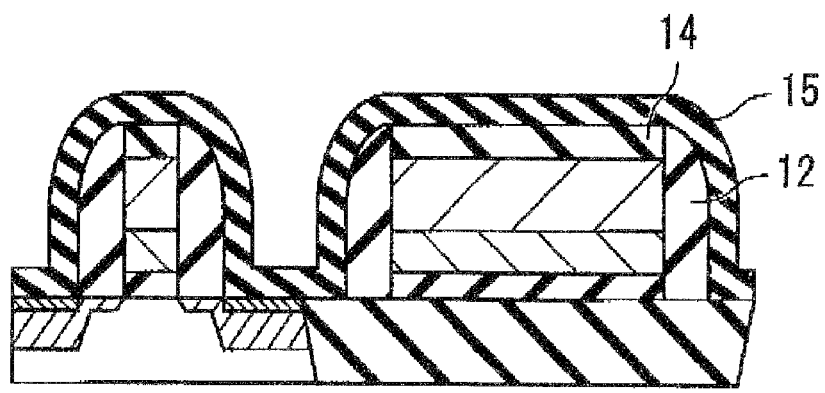

Next, as shown in FIG. 3D, the stopper nitride film 15 is deposited over the transistor formation region and the resistive element formation region. The stopper nitride film 15 functions as an etching stopper and a stress liner. For example, a SiN film is used as the stopper nitride film 15.

Figure 3E:
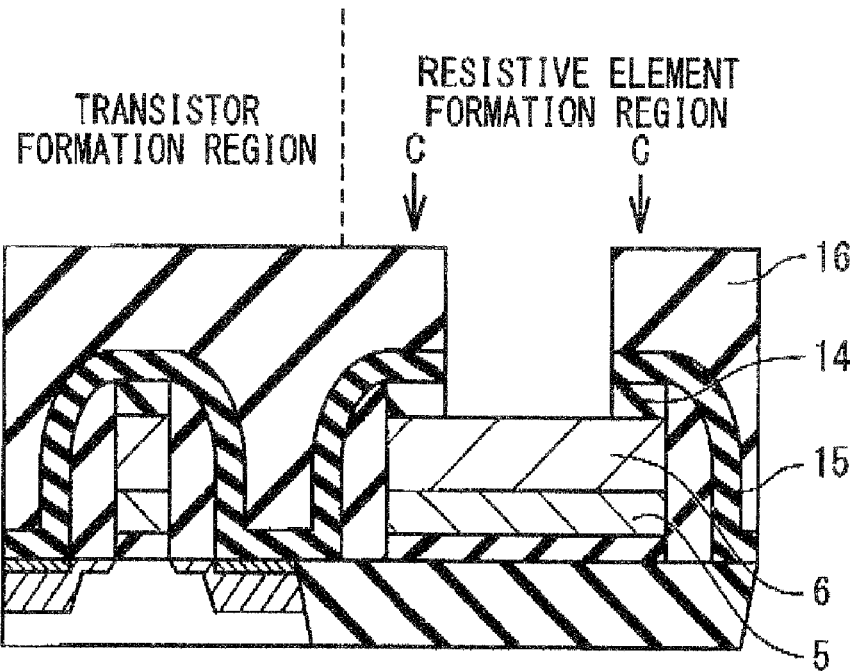

Next, as shown in FIG. 3E, the transistor formation region and the resistive element formation region are covered by a resist 16. Then, the stopper nitride film 15 and the hard mask 14 in a part (first region) of the resistive element formation region are removed through a lithography process. As a result, the second metal film 6 is exposed. At this time, the stopper nitride film 15 and the hard mask 14 in a contact hole formation region C (second region) in the resistive element formation region are left unremoved.

The contact hole formation region C included in the resistive element formation region is a region in which the contact hole 11 connected to the resistive element section 8 is formed. Here, displacement and variation of opening area during the lithography process are taken into consideration as a margin. That is, the contact hole formation region C includes an entire region where the contact hole 11 is potentially formed.

Figure 3F:
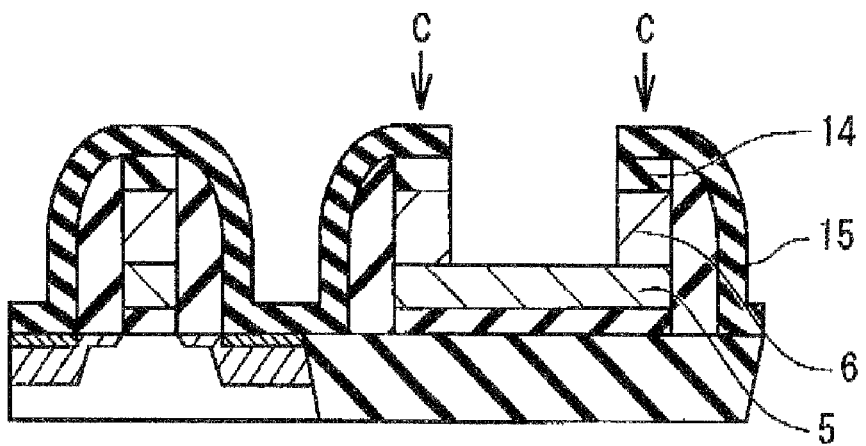

Next, as shown in FIG. 3F, the resist 16 is removed. Then, the exposed second metal film 6 is etched with using the hard mask 14 and the stopper nitride film 15 as an etching mask. It should be noted here that the second metal film 6 in the contact hole formation region C is not etched, because the contact hole formation region C is protected by the etching mask.

Figure 3G:
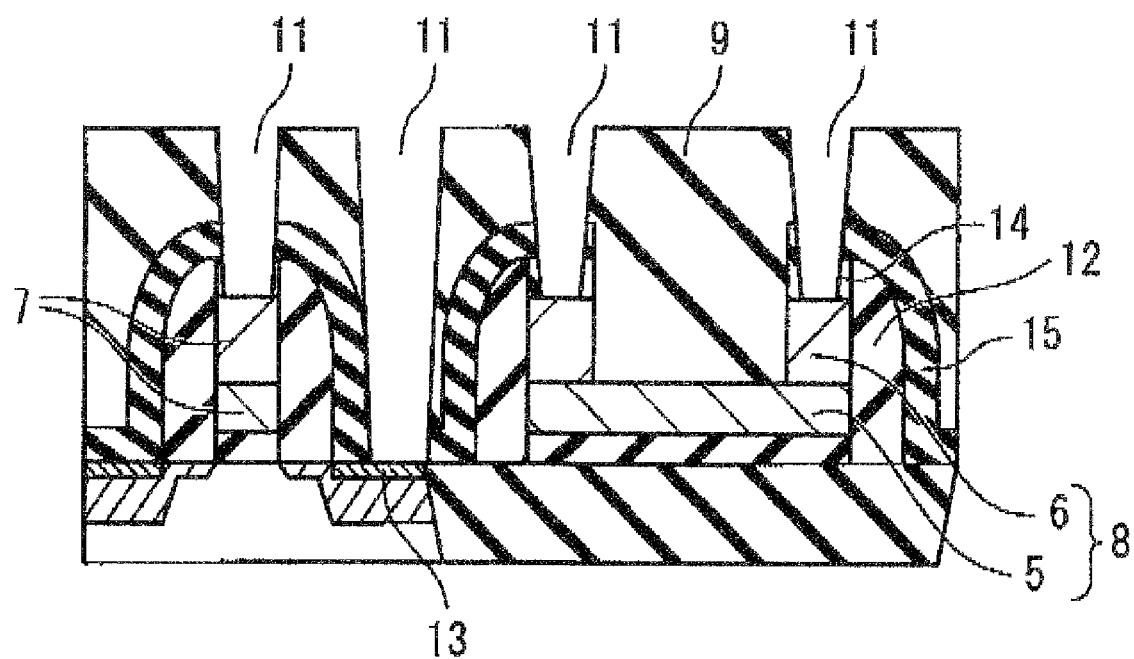

Next, as shown in FIG. 3G, an oxide film as the interlayer insulating film 9 is blanket deposited, and then the oxide film is planarized by the CMP (Chemical Mechanical Polishing) method. After the planarization, the group of contact holes 11 is formed by etching the interlayer insulating film 9, the stopper nitride film 15 and the hard mask 14. At this time, a contact hole 11 exposing the gate electrode 7, a contact hole 11 exposing the silicide layer 13 on the source/drain region 3, and a contact hole 11 exposing the second metal film 6 of the resistive element section 8 are formed simultaneously.

When the group of contact holes 11 is formed, the interlayer insulating film 9 is first etched and then the stopper nitride film 15 and the hard mask 14 are etched. The contact hole 11 leading to the resistive element section 8 is shorter than the contact hole 11 leading to the source/drain region 3 (silicide layer 13). Due to the difference between lengths of the contact holes 11, the stopper nitride film 15 in the resistive element formation region is exposed early at the etching of the interlayer insulating film 9. Usually, the etching condition is set such that the interlayer insulating film 9 ($SiO_2$) is etched more selectively than the stopper nitride film 15 (SiN). Even in that case, a remaining film of the stopper nitride film 15 after the etching of the interlayer insulating film 9 becomes less on the side of the resistive element section 8 than on the side of the source/drain region 3. After that, when the stopper nitride film 15 is etched, the resistive element section 8 is exposed earlier than the source/drain region 3. That is to say, a time for which the resistive element section 8 is exposed during the etching becomes longer. If a film thickness of the resistive element section 8 is small, the resistive element section 8 may be removed due to the etching, which is a problem. According to the present embodiment, a sufficient thickness (first metal film 5+second metal film 6) is retained for the resistive element section 8 in the contact hole formation region C. Therefore, in the process of forming the contact hole 11, the formed contact hole is prevented from penetrating through the resistive element section 8, even if the first metal film 5 is thin.

After that, the wiring layer 10 is so formed over the interlayer insulating film 9 as to fill the group of contact holes 11. Consequently, the semiconductor device shown in FIG. 2 is manufactured.

The first metal film 5 will be described below in more detail. The first metal film 5 is a metal film being in contact with the gate insulating film 4. In a case where the transistor formed in the transistor formation region is an nMOSFET, material whose work function is lower than the mid gap (4.6 eV) is required for the gate electrode 7 being in contact with the gate insulating film 4. On the other hand, in a case when a pMOSFET is formed in the transistor formation region, material whose work function is higher than the mid gap is required. Therefore, the first metal film 5 may be different between in the case of the pMOSFET and in the case of the nMOSFET. Whereas, there is no limitation on the work function of the first metal film 5 from a viewpoint of the resistive element section 8.

The film thickness and resistivity of the first metal film 5 are as follows. The film thickness of the first metal film 5 is preferably determined based on a resistance value required for the resistive element section 8. Let us consider a case where a sheet resistance required for the resistive element section 8 is about 200 Ω/square. When a metal film whose resistivity is 200 μΩcm is used, a thickness of 10 nm is necessary for achieving the sheet resistance. Therefore, the thickness of the first metal film 5 is set to 10 nm when the resistivity is 200 μΩcm. Similarly, the thickness of the first metal film 5 is set to 20 nm when the metal film whose resistivity is 400 μΩcm is used.

Whereas, it is desirable from a viewpoint of the gate electrode 7 that the film thickness of the first metal film 5 is not less than 5 nm for achieving the work function. When the film thickness is not less than 5 nm, it is desirable from a viewpoint of the resistance value of the resistive element section 8 that the resistivity of the first metal film 5 is not less than 100 μΩcm.

Furthermore, there is also another requirement from a viewpoint of dry etching process. When a metal film that is not easily etched is used as the first metal film 5, it is preferable that the first metal film 5 is as thin as possible.

Considering the above, it is desirable for the first metal film 5 that a metal film whose resistivity is not more than 600 μΩcm is used and the film thickness is set to not more than 30 nm.

The following Table 1 shows material candidates for the first metal film 5. As mentioned above, material whose work function is lower than the mid gap (4.6 eV) is used for the first metal film 5 of the gate electrode 7 of the nMOSFET, and material whose work function is higher than the mid gap is used for the first metal film 5 of the gate electrode 7 of the pMOSFET.

TABLE 1

CANDIDATES OF FIRST METAL FILM MATERIAL

| MATERIAL | WORK FUNCTION (eV) | RESISTIVITY (uΩ · cm) |
| --- | --- | --- |
| HfC | 4.1 | 100-1000 |
| HfN | 4.3 | 15-140 |
| TaC | 4.2 | 300 |
| TaSiN | 4.3-4.4 | 300-2400 |
| TaN | 4.5 | 250-300 |
| TiN | 4.8 | 50-130 |
| WN | 5.0 | — |

Next, the second metal film 6 will be described below in more detail. As mentioned above, the second metal film 6 is provided for the purpose of retaining a thickness of the resistive element section 8 in the contact hole formation region C. In a MOS transistor, it may be considered to use a stacked structure of a metal film and a polysilicon film as a gate electrode. In the case where the polysilicon film is used, however, the gate resistance becomes larger, which may cause deterioration of high-frequency characteristics. According to the present embodiment, the second metal film 6 is used, which can make the resistivity lower as compared with the case where the polysilicon film is used. As a result, excellent high-frequency characteristics can be obtained. The second metal film 6 does not contact the gate insulating film 4. Therefore, there is no constraint of the work function on the second metal film 6. It is not necessary to select different materials between in the case of the nMOSFET and in the case of the pMOSFET.

The gate electrode 7 and the resistive element section 8 are required to be processed perpendicular to the semiconductor substrate 1 as possible. Therefore, material that is easily etched at the dry etching is desirable for the second metal film 6.

As shown in FIG. 3F, the second metal film 6 of the resistive element section 8 is etched except for the contact hole formation region C. It is therefore preferable that dry etching selectivity of the second metal film 6 with respect to the first metal film 5 is high. In other words, the second metal film 6 is preferably formed of material which is selectively etched even in a condition that the first metal film 5 is not etched. By selecting such material, the film thinning of the first metal film 5 can be suppressed even if the first metal film 5 is exposed during the etching of the second metal film 6. Consequently, variability of the resistance value of the resistive element section 8 can be suppressed.

The following Table 2 shows material candidates for the second metal film 6. Since the dry etching process can be easily done and the resistivity is low, W and Mo exemplified in Table 2 are preferable as the second metal film 6. The resistivity of W and Mo is about 5 μΩcm. Compared with the candidates for the first metal film 5 shown in the foregoing Table 1, the resistivity of W and Mo is about 1/10 to 1/100. Therefore, the resistance value (gate resistance) of the gate electrode 7 can be made smaller. Whereas, the resistivity is too low it W or Mo is used as the resistive element section 8. It is therefore preferable that W or Mo is used not as the first metal film 5 but as the second metal film 6.

TABLE 2

CANDIDATES OF SECOND METAL FILM MATERIAL

| MATERIAL | RESISTIVITY (uΩ · cm) (R.T.) |
| --- | --- |
| W | 5.6 |
| Mo | 5.3 |

A film thickness of the second metal film 6 is as follows. When material that is easily etched at the dry etching is used for the second metal film 6, there is no constraint on the film thickness of the second metal film 6 in terms of ease of the dry etching. However, if the second metal film 6 is completely removed at the time of forming the contact hole 11 (refer to FIG. 3G) the first metal film 5 may be exposed and etched. If the exposed first metal film 5 is etched during an over etching process for forming the contact hole 11, the contact resistance increases and variability between chips is also increased. It is therefore preferable that the film thickness of the second metal film 6 is designed such that the second metal film 6 still remains after the etching process for forming the contact hole 11. Moreover, when the group of contact holes 11 is formed, the contact hole 11 leading to the source/drain region 3 and the contact hole 11 leading to the resistive element section 8 are formed simultaneously. Since the contact hole 11 leading to the resistive element section 8 is shorter than the contact hole 11 leading to the source/drain region 3, a time for which the second metal film 6 of the resistive element section 8 becomes longer. In other words, the over etching time becomes longer with respect to the resistive element section 8. Therefore, the film thickness of the second metal film 6 is designed in view of the difference in the height between the contact holes 11.

Next, an etching condition at the time of the etching of the second metal film 6 in the resistive element formation region (refer to FIG. 3F) will be described below in more detail.

As described above, if the first metal film 5 is etched, the resistance value of the resistive element section 8 increases. Therefore, the etching condition at the time of the etching of the second metal film 6 of the resistive element section 8 is preferably designed such that the first metal film 5 is not etched and only the second metal film 6 is selectively etched.

It should be noted that the dry etching is preferable for etching the second metal film 6. Since the dry etching is an anisotropic etching, a section masked (protected) by the stopper nitride film 15 is prevented from being removed by side etching. On the other hand, if a wet etching that is an isotropic etching is performed, a section protected by the stopper nitride film 15 may be etched due to the side etching. That is to say, the second metal film 6 in the contact hole formation region C may be etched. Therefore, when the wet etching is employed, the side etching amount should be considered as a margin when performing the etching.

According to the present embodiment, as described above, the gate electrode is formed of the metal film and thus the gate resistance can be made small. Furthermore, a substantive thickness of the resistive element section 8 can be suppressed to the film thickness of the first metal film 5, and the second metal film 6 prevents the resistive element section 8 from being etched at the time of forming the contact hole 11. Consequently, it is possible not only to make the resistance value of the resistive element section 8 comparable to that of a polysilicon resistive element but also to reduce the variability of the resistance value.

MODIFIED EXAMPLE

Next, a modified example of the present embodiment will be described below. As described in the foregoing embodiment, the second metal film 6 is selectively etched at the time of the etching of the second metal film 6 in the resistive element formation region. However, there may be a case where etching selectivity of the second metal film 6 with respect to the first metal film 5 cannot be set large. For example, let us consider a case where W is used as the second metal film 6 and TiN, TaN, TaSiN, WN or the like is used as the first metal film 5. In this case, the first metal film 5 is expected to be etched for several nanometers to several tens of nanometers at the time of the over etching of the second metal film 6 (W). If an initial film thickness of the first metal film 5 is small, the film thinning due to the over etching may cause variation in the resistance value of the resistive element section 8.

Therefore, according to the present modified example, a conductive etching sacrifice layer 17 (barrier layer 17) is provided between the first metal film 5 and the second metal film 6.

FIGS. 4A to 4G are cross-sectional views showing manufacturing processes of the semiconductor device according to the present modified example. The same reference numerals are given to the same components as those described in the foregoing embodiment, and an overlapping description will be omitted as appropriate.

Figure 4A:
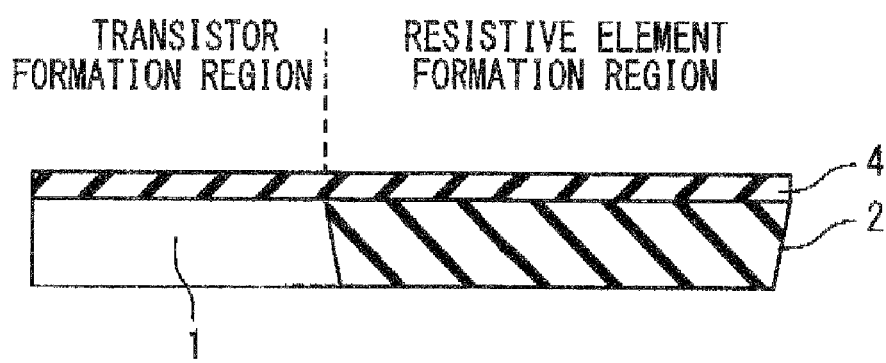
FIGS. 4A to 4G are cross-sectional views showing manufacturing processes of a semiconductor device according to a modified example of the embodiment.

First, as shown in FIG. 4A, the STI 2 is formed on the semiconductor substrate 1. Moreover, the gate insulating film 4 is formed on the semiconductor substrate 1.

Figure 4B:
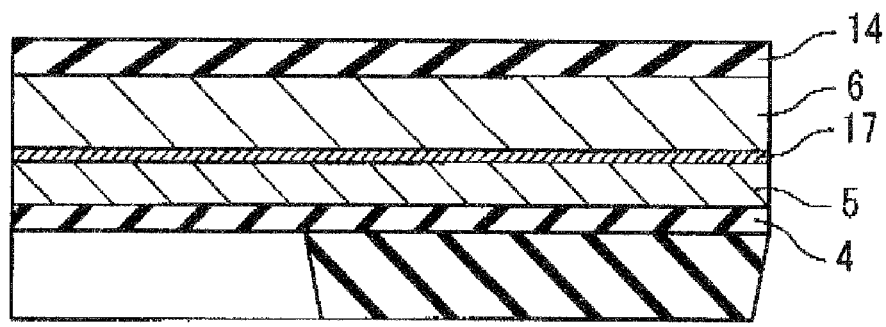

Next, as shown in FIG. 4B, the first metal film 5, the barrier layer 17, the second metal film 6 and the hard mask 14 are formed in this order.

Figure 4C:
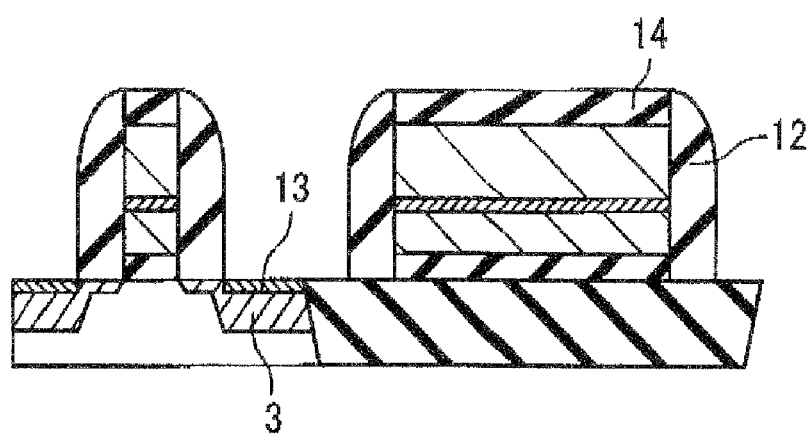

Next, as shown in FIG. 4C, the stacked film is patterned. Then, the side wall 12 and the silicide layer 13 are formed.

Figure 4D:
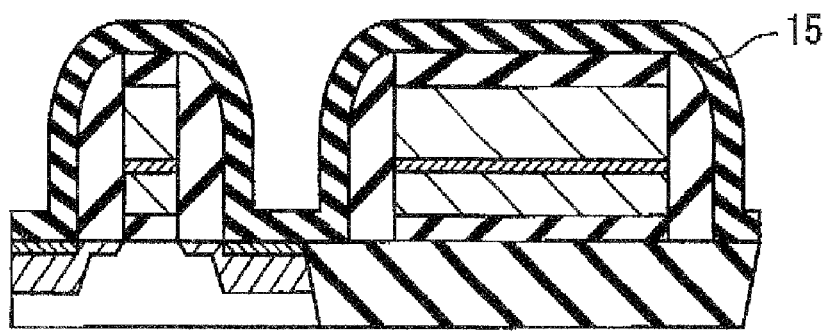

Next, as shown in FIG. 4D, the stopper nitride film 15 is formed.

Figure 4E:
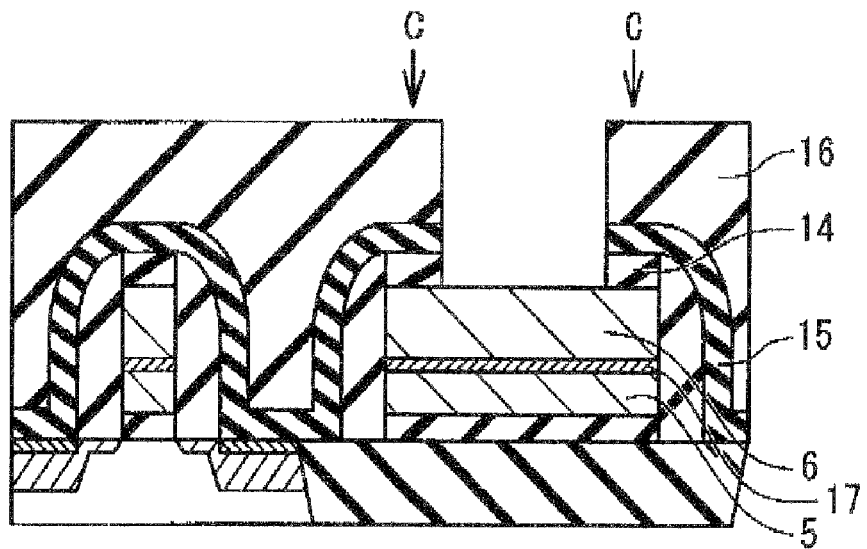

Next, as shown in FIG. 4E, the second metal film 6 in the resistive element formation region is exposed by a lithography method with using the resist 16 as a mask. At this time, the second metal film 6 in the contact hole formation region C is protected.

Figure 4F:
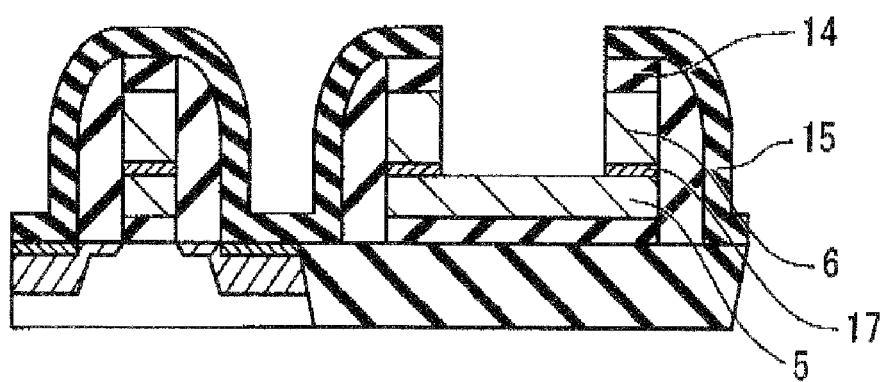

Next, as shown in FIG. 4F, the second metal film 6 and the barrier layer 17 are etched by using the hard mask 14 and the stopper nitride film 15 as a mask.

Figure 4G:
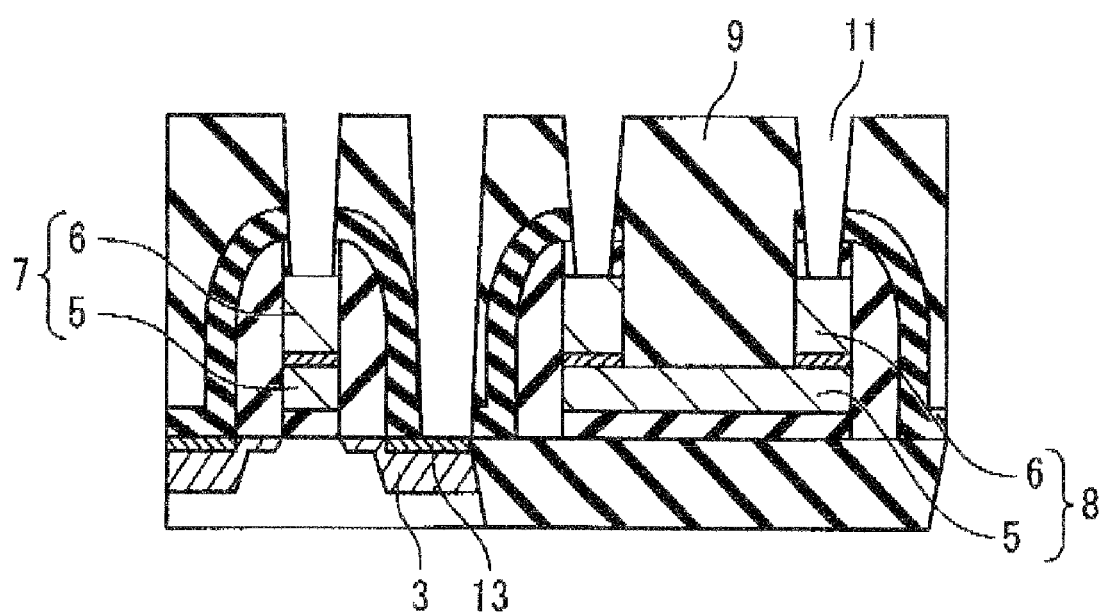

Next, as shown in FIG. 4G, the interlayer insulating film 9 is formed. Furthermore, the contact holes 11 are so formed as to penetrate through the interlayer insulating film 9.

After that, the wiring layer 10 (not shown) is formed. Consequently, the semiconductor device according to the present modified example is manufactured.

According to the present modified example, the barrier layer 17 is provided between the first metal film 5 and the second metal film 6, which can suppress the thinning of the first metal film 5 at the time when the second metal film 6 is etched.

A conductive material is used for the barrier layer 17. In particular, a conductive material with which dry etching selectivity of the second metal film 6 with respect to the barrier layer 17 is large and dry etching selectivity of the barrier layer 17 with respect to the first metal film 5 is large is preferable for the barrier layer 17.

For example, let us consider the following case. That is, a film thickness of the first metal film 5 is 20 nm, and a film thickness of the second metal film 6 is 80 nm. The dry etching selectivity of the second metal film 6 with respect to the first metal film 5 is 5. In other words, an amount for which the first metal film 5 is etched is one-fifth of an amount for which the second metal film 6 is etched under the same condition. Moreover, an over etching of 30% is necessary for completely removing the second metal film 6 in the resistive element section 8. In this case, the first metal film 5 in the resistive element section 8 is etched for about 4.8 nm (=80 nm*30%/5) to the maximum at the time of the over etching. In the worst case, the remaining thickness of the first metal film 5 is only 15.2 nm (=20 nm−4.8 nm), and thus the film thickness variation of the first metal film 5 becomes 24% (=4.8/20). In this manner, the film thickness variation becomes greater when the film thinning amount of the first metal film 5 becomes larger.

Whereas, according to the present modified example, the barrier layer 17 is provided between the first metal film 5 and the second metal film 6, which can suppress the film thickness variation of the first metal film 5. Let us consider a case where dry etching selectivity of the second metal film 6 with respect to the barrier layer 17 is 5, and dry etching selectivity of the barrier layer 17 with respect to the first metal film 5 is 3. Moreover, a film thickness of the barrier layer 17 is 10 nm. In this case, the barrier layer 17 in the resistive element section 8 is etched for about 4.8 nm (=80 nm*30%/5) to the maximum, and the remaining thickness of the barrier layer 17 is 5.2 nm (=10 nm−4.8 nm). Then, an over etching of 100% is performed with respect to the remaining barrier layer 17 (5.2 nm) in order to remove the remaining barrier layer 17. In other words, an over etching corresponding to an etching of the barrier layer 17 of 5.2 nm is further performed. In this case, an amount for which the first metal film 5 is etched is about 1.7 nm (=5.2 nm/3). Thus, the film thickness variation of the first metal film 5 is 8.5% (=1.7/20) to the maximum. The film thickness variation of the first metal film 5 can be suppressed as compared with the foregoing case where the barrier layer 17 is not provided.

The film thickness of the barrier layer 17 is set such that the barrier layer 17 is not thoroughly removed by the over etching for removing the second metal film 6 in the resistive element section 8. There is no specific constraint on the upper limit of the film thickness of the barrier layer 17. However, it is preferable that the barrier layer 17 is as thin as possible, from a viewpoint of reducing the amount for which the film metal film 5 is etched.

When the first metal film 5 is formed of TaSiN, WN or the like, it is preferable in terms of the etching selectivity to use TiN as a material of the barrier layer 17.

In a case where W is formed as the second metal film 6 by the CVD method, fluorine may be included in material gas and atmosphere gas. In this case, it is preferable that the barrier layer 17 has a barrier property against fluorine in order to eliminate influence of fluorine. From a view point of the barrier property against fluorine, TiN, TaN, TaSiN, HfN and the like are preferable for the barrier layer 17.

Next, several examples are described below in order to explain the present invention in more detail.

First Example

In the present example, a CMOS transistor where both of an NMOS transistor and a PMOS transistor are formed will be described. The first metal film 5-N on the NMOS transistor side is a HfN film, and the first metal film 5-P on the PMOS transistor side is a TiN film. The second metal film 6 is a W (tungsten) film. The first metal film 5 in the resistive element section 8 is a HfN film. The gate insulating film 4 is a HfSiON film. A SiON film, a high-k film including Hf and the like are also possible for the gate insulating film 4.

FIGS. 5A to 5G are cross-sectional views showing manufacturing processes of the semiconductor device according to the first example.

Figure 5A:
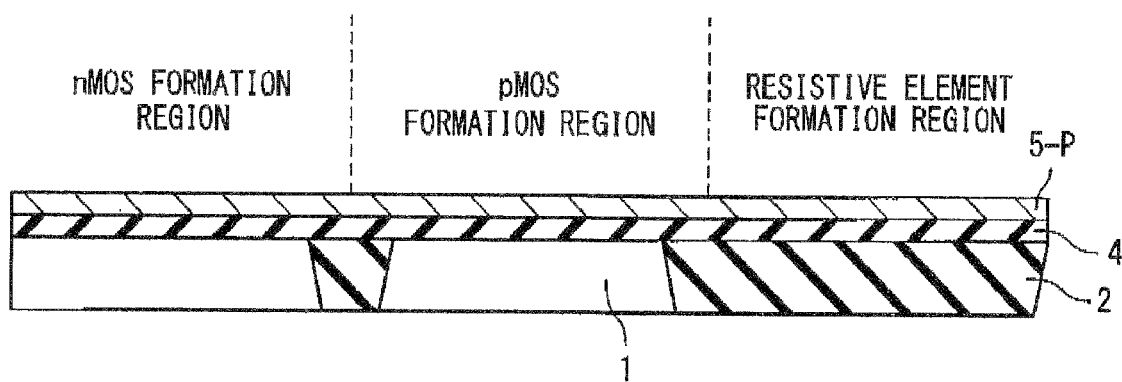
FIGS. 5A to 5G are cross-sectional views showing manufacturing processes of a semiconductor device according to a first example.
Figure 5B:
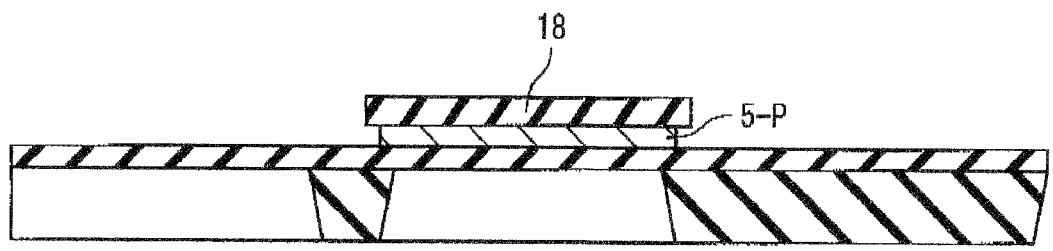

As shown in FIG. 5A, diffusion layers, the STI 2 and the gate insulating film 4 are formed in accordance with the well-known CMOS fabrication process. After that, a TiN film is formed as the first metal film 5-P that is at least used for the PMOS transistor. The first metal film 5-P is formed by a reactive sputtering method using Ti target in nitrogen atmosphere. A film thickness of the formed first metal film 5-P is 10 nm.

Next, as shown in FIG. 5S, a hard mask 18 is formed on the first metal film 5-P. The hard mask 18 is formed in a PMOS formation region by the lithography method. An amorphous silicon (a-Si) film is used as the hard mask 18. Further, the first metal film 5-P in the NMOS formation region and the resistive element formation region is wet-etched with using ammonia-hydrogen peroxide solution. At the time of the wet etching, a part of the first metal film 5-P in the PMOS formation region may be etched due to side etching. However, since the first metal film 5-P is thereafter processed to be desired gate pattern and resistive element pattern, there is no problem even if the first metal film 5-P is slightly etched at this stage.

Figure 5C:
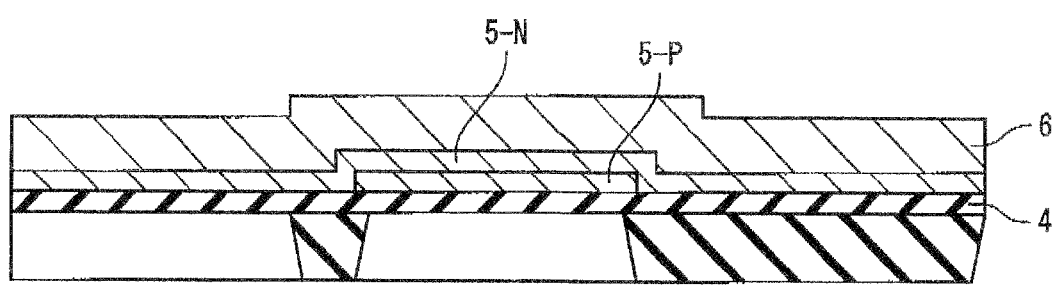

Next, as shown in FIG. 5C, the hard mask 18 is selectively removed by wet etching. After that, a HfN film is formed as the first metal film 5-N that is at least used for the NMOS transistor A film thickness of the formed first metal film 5-N is 10 nm. The first metal film 5-N is formed by a reactive sputtering method in nitrogen atmosphere. Furthermore, a W film as the second metal film 6 is formed on the first metal film 5-N. The second metal film 6 is formed by the CVD method. A film thickness of the formed second metal film 6 is 80 nm.

Consequently, in the PMOS formation region, the W film (second metal film 6), the HfN film (first metal film 5-N) and the TiN film (first metal film 5-P) are formed in this order from the top. Whereas, in the NMOS formation region and the resistive element formation region, the HfN film (first metal film 5-N) and the W film (second metal film 6) are stacked in this order on the gate insulating film 4.

Figure 5D:
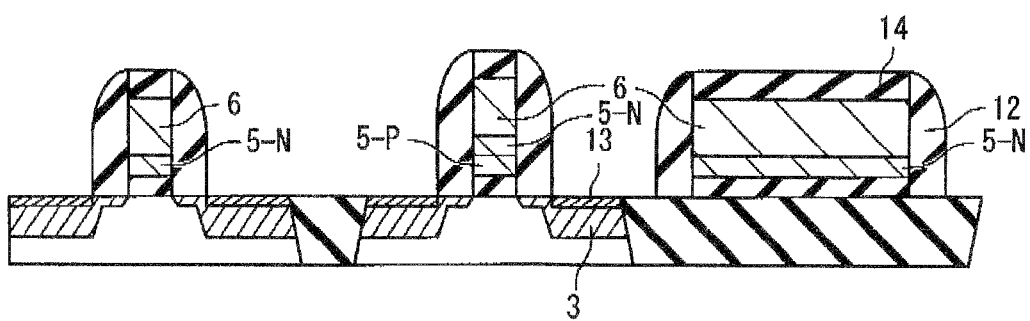

Next, as shown in FIG. 5D, a hard mask 14 used for forming the gate electrode 7 and the resistive element section 8 is formed. The hard mask 14 is a SiN film with a thickness of 60 nm. The SiN film of 60 nm as the hard mask 14 is formed by the CVD method. The hard mask 14 is patterned through a lithography process using a resist such that the hard mask 14 is left only in the gate electrode formation region and the resistive element formation region. After the resist is removed, an etching is performed with using the remaining hard mask 14 such that the gate insulating film 4 is exposed. Here, the HfN film (first metal film 5-N) is dry-etched by using gas including $Cl_2$ and $O_2$. The film thickness of the hard mask 14 after the etching is about 30 nm. Subsequently, offset spacer, extension, the side wall 12, the source/drain region 3 and the silicide layer 13 are formed by using the hard mask 14 in accordance with the well-known CMOS fabrication process. At this time, the silicide metal is not formed on the W film (second metal film 6), since the hard mask 14 is left. Thus, the silicide layer 13 is selectively formed on the source/drain region 3.

Figure 5E:
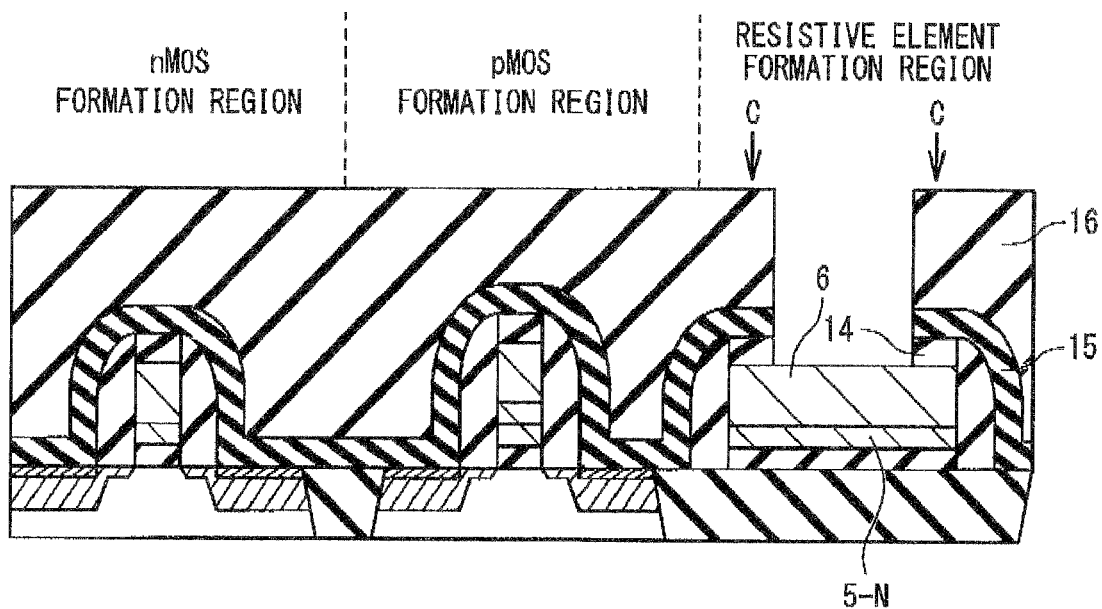

Next, as shown in FIG. 5E, a SiN film as the stress liner film 15 is blanket deposited by the plasma CVD method. The stress liner film 15 is formed for the purpose of applying stress to a channel region and being an etching stopper when the contact hole 11 is formed. A film thickness of the formed stress liner film 15 is 40 nm. Furthermore, the stress liner film 15 and the hard mask 14 are removed through the lithography using the resist 16 as a mask, such that the second metal film 6 in the resistive element formation region is exposed. At this time, the contact hole formation region C is kept covered by the hard mask 14 and the stress liner film 15.

Figure 5F:
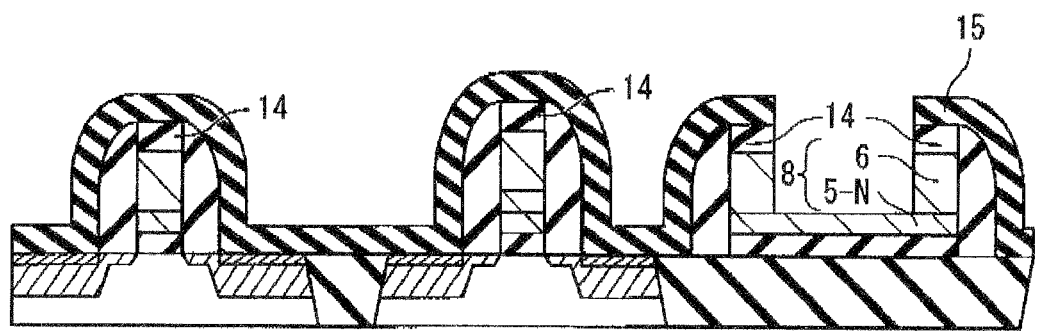

Next, as shown in FIG. 5F, the resist 16 is removed. After that, the second metal film 6 (W) is removed by reactive ion etching (RIE) with using the hard mask 14 and the stress liner film 15 as a mask. The reactive ion etching is performed by using $SF_6$ gas. At this time, the first metal film 5-N (HfN) as a base layer may be etched due to the over etching. Note here that the etching selectivity (W/HfN) can be set to about 30 by controlling the etching condition. The over etching of 30% is performed at the time of the etching of the second metal film 6. The amount for which the HfN film (first metal film 5-N) is etched due to the over etching is about 0.8 nm (=80 nm*30%/30). The sheet resistance of the first metal film 5-N (HfN) after the etching of the second metal film 6 (W) is 110±15 Ω/square. It is thus confirmed that the variation in the resistance value of the resistive element can be suppressed to a very narrow range and the first metal film 5-N can sufficiently function as the resistive element.

Figure 5G:
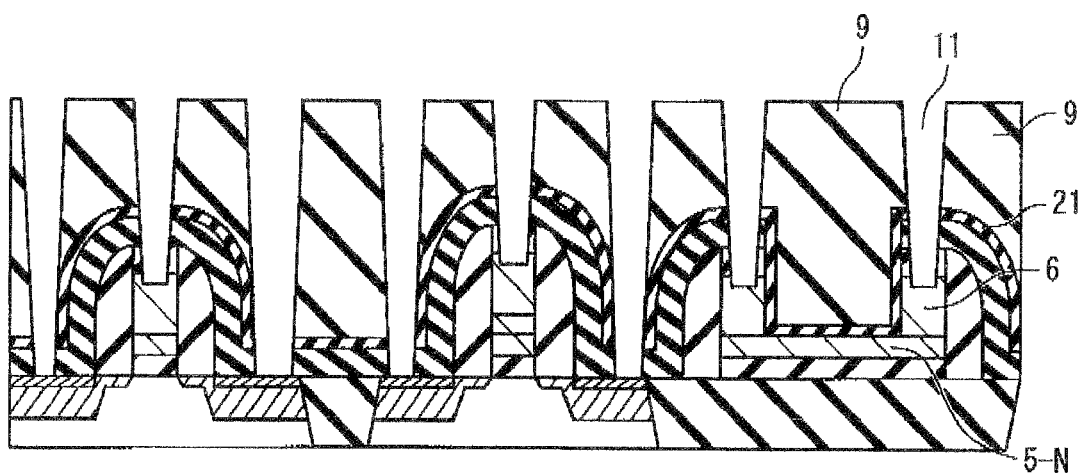

Next, as shown in FIG. 5G, a $SiO_2$ film having a thickness of 300 nm as the interlayer insulating film 9 is blanket deposited by the CVD method. As a result, a section from which the second metal film 6 is removed within the resistive element formation region is filled in with the interlayer insulating film 9. Here, a thin additional protection film 21 may be formed before depositing the interlayer insulating film 9 ($SiO_2$), in order to prevent oxidation of the exposed first metal film 5-N. In the present example, a SiN film having a thickness of 10 nm is formed as the additional protection film 21. After the interlayer insulating film 9 is deposited, a surface of the interlayer insulating film 9 is planarized by a CMP method. Furthermore, the RIE is performed for forming the group of contact holes 11.

In the gate electrode formation region and the resistive element formation region, the stopper nitride film 15 (50 nm) and the hard mask 14 (SiN; 30 nm) exist under the interlayer insulating film 9. On the other hand, the hard mask 14 does not exist on the source/drain region 3 (silicide layer 13). Therefore, in the region of the contact hole 11 leading to the source/drain region 3, an over etching is performed for about a thickness of the hard mask 14. However, a film thickness of the interlayer insulating film 9 on the source/drain region 3 is larger than a film thickness of the interlayer insulating film 9 on the gate electrode 7 and the resistive element section 8 by about a thickness of the gate electrode 7 and the hard mask 14. Therefore, an excessive over etching is not applied on the silicide layer 13 on the source/drain region 3.

In the region of the contact hole 11 leading to the resistive element section 8, a part of the SiN layer (stress liner film 15 and the hard mask 14) is removed due to the over etching at the time of the etching of the interlayer insulating film 9. It is therefore expected that the resistive element section 8 as a base layer is etched due to the over etching at the time of the etching of the SiN layer. However, in the region of the contact hole 11 leading to the resistive element section 8, the film thickness of the second metal film 6 (W) is as much as 80 nm. Thus, the film thinning of the second metal film 6 after the etching of the SiN layer does not affect the resistance value of the resistive element section 8 as a whole.

As a comparative example, let us consider a case where the second metal film 6 (W) is not provided in the contact hole formation region C within the resistive element formation region. In this case, the first metal film 5-N (HfN) is exposed during the over etching process at the time when the contact hole 11 is formed. The film thickness of the interlayer insulating film 9 after the CMP is about 200 nm. In order to completely remove the interlayer insulating film 9 of 200 nm, an over etching is usually performed such that the interlayer insulating film 9 is excessively etched for about 60 nm. Moreover, the stopper nitride film 15 (50 nm) and the hard mask 14 (30 nm) exist on the gate electrode 7. Therefore, the first metal film 5-N is exposed to etching atmosphere that removes a film thickness corresponding to at least 190 nm. Even if the etching is performed under a condition that the first metal film 5-N (HfN) is not easily etched, there is possibility that the first metal film 5-N is completely removed or becomes very thin, which causes increase in the contact resistance.

According to the present example, since a base layer of the contact hole 11 leading to the resistive element section 8 has a two-layer structure of the first metal film 5-N (HfN) and the second metal film 6 (W), the second metal film 6 lessens the over etching amount at the time when the contact hole 11 is formed. As a result, the increase in the contact resistance can be suppressed. Moreover, the resistive element section 8 in a region other than the contact hole formation region consists of only the first metal film 5-N. It is thus possible to achieve the resistance value required for the resistive element section 8

A preferable combination of the first metal film 5-N and the second metal film 6 with which the second metal film 6 can be selectively etched is as follows. When W is used as the second metal film 6, oxide of noble metal such as Ru, Pt and Pd, silicide of noble metal such as Ru, Pt and Pd, silicide including Hf, nitride including Hf and the like are preferable for the first metal film 5-N. In the cases of such combinations, the second metal film 6 can be selectively etched by appropriately controlling the etching condition. In a case of a combination with which the selective etching of the second metal film 6 is difficult, etching conditions of the wet etching and dry etching need to be adjusted. Regarding a type of etching, the dry etching may be desirable in terms of an aperture size of the contact hole 11.

Second Example

In the second example, a case where the barrier layer 17 is provided will be described. In the present example, the first metal film 5-N on the NMOS transistor side is a TaSiN film, and the first metal film 5-P on the PMOS transistor side is a TiN film. The barrier layer 17 is a TiN film. The second metal film 6 is a W film. The first metal film 5 in the resistive element section 8 is a TaSiN film, which is the same as the first metal film 5-N. Etching selectivity of W with respect to TaSiN is not so large. Therefore, the TiN layer is used as the barrier layer 17.

FIGS. 6A to 6G are cross-sectional views showing manufacturing processes of the semiconductor device according to the second example.

Figure 6A:
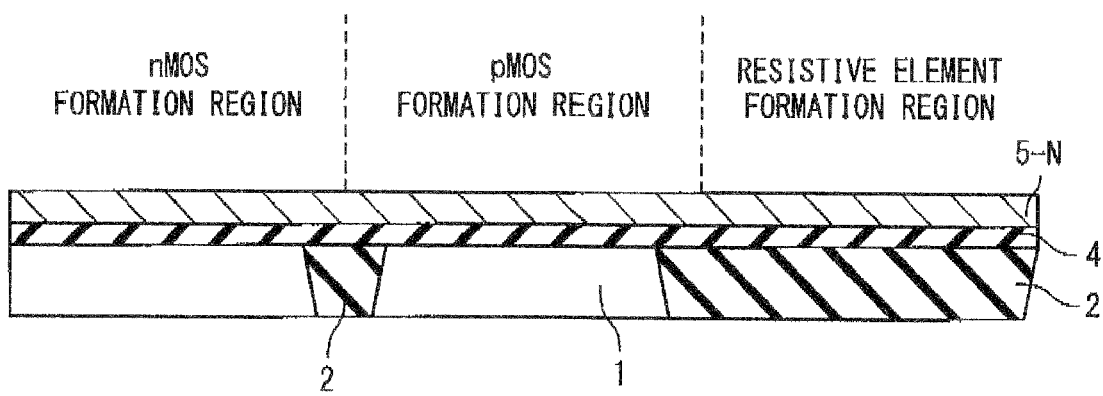
FIGS. 6A to 6G are cross-sectional views showing manufacturing processes of a semiconductor device according to a second example.

As shown in FIG. 6A, diffusion layers, the STI 2 and the gate insulating film 4 are formed in accordance with the well-known CMOS fabrication process. The gate insulating film 4 is a HfSiON film. A SiON film, a high-k film including Hf and the like are also possible for the gate insulating film 4. After that, a TaSiN film is formed as the first metal film 5-N that is at least used for the NMOS transistor. The first metal film 5-N is formed by the reactive sputtering method using TaSiN target in nitrogen atmosphere. A film thickness of the formed first metal film 5-N is 20 nm.

Figure 6B:
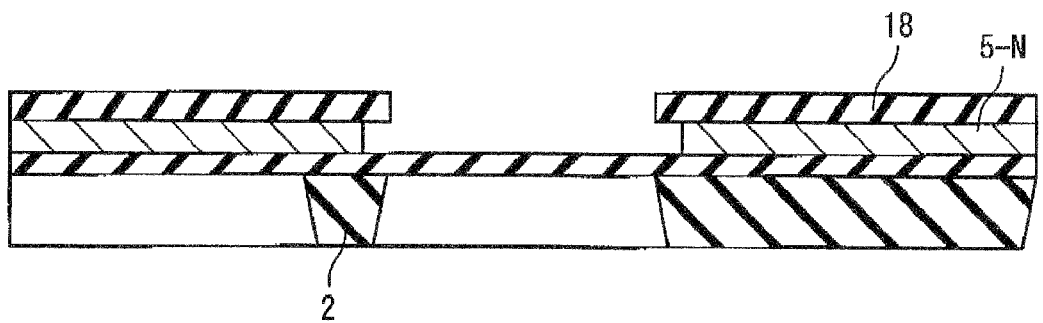

Next, as shown in FIG. 6B, an amorphous silicon (a-Si) layer as a hard mask 18 is formed on the first metal film 5-N through the lithography process. The hard mask 18 is formed in the NMOS formation region and the resistive element formation region. Further, the first metal film 5-N in the PMOS formation region is wet-etched with using ammonia-hydrogen peroxide solution. At the time of the wet etching, a part of the first metal film 5-N covered by the hard mask 18 may be etched due to side etching. However, since the first metal film 5-N is thereafter processed to be desired gate pattern and resistive element pattern, there is no problem even if the first metal film 5-N is slightly etched at this stage.

Figure 6C:
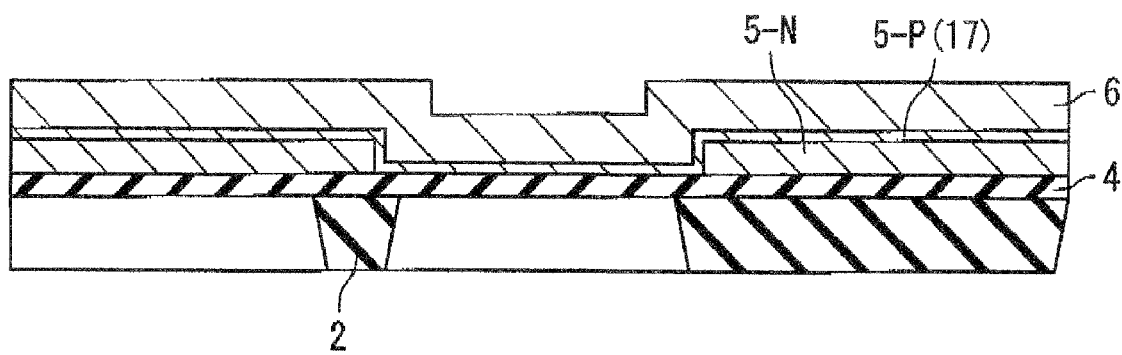

Next, as shown in FIG. 6C, the hard mask 18 is selectively removed by wet etching. After that, a TiN film having a thickness of 10 nm is formed by the reactive sputtering method using Ta target in nitrogen atmosphere. The TiN film functions as both of the first metal film 5-P on the PMOS transistor side and the barrier layer 17. Furthermore, a W film as the second metal film 6 is formed on the TiN film by the CVD method. A film thickness of the formed second metal film 6 is 80 mm.

Consequently, in the PMOS formation region, the W film (second metal film 6) and the TiN film (first metal film 5-P, barrier layer 17) are formed in this order from the top. Whereas, in the NMOS formation region and the resistive element formation region, the TaSiN film (first metal film 5-N), the TiN film (first metal film 5-P, barrier layer 17) and the W film (second metal film 6) are stacked in this order on the gate insulating film 4.

Figure 6D:
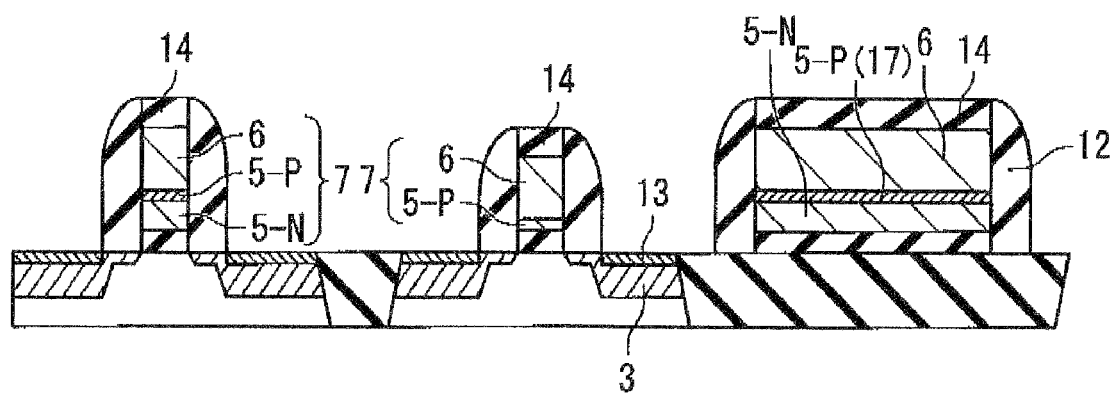

Next, as shown in FIG. 6D, a hard mask 14 used for forming the gate electrode 7 and the resistive element section 8 is formed. The hard mask 14 is a SiN film with a thickness of 60 nm. The SiN film of 60 nm as the hard mask 14 is formed by the CVD method. The hard mask 14 is patterned through a lithography process using a resist such that the hard mask 14 is left only in the gate electrode formation region and the resistive element formation region. After the resist is removed, an etching is performed with using the remaining hard mask 14 as a mask such that the gate insulating film 4 is exposed and the side surface becomes vertical. The film thickness of the hard mask 14 after the etching is about 30 nm. Subsequently, offset spacer, extension, the side wall 12, the source/drain region 3 and the silicide layer 13 are formed by using the hard mask 14 in accordance with the well-known CMOS fabrication process. At this time, the hard mask 14 is left on the top surfaces of the gate electrode 7 and resistive element section 8. Therefore, the silicide metal is not formed on the W film as the second metal film 6. Thus, the silicide layer 13 is selectively formed on the source/drain region 3.

Figure 6E:
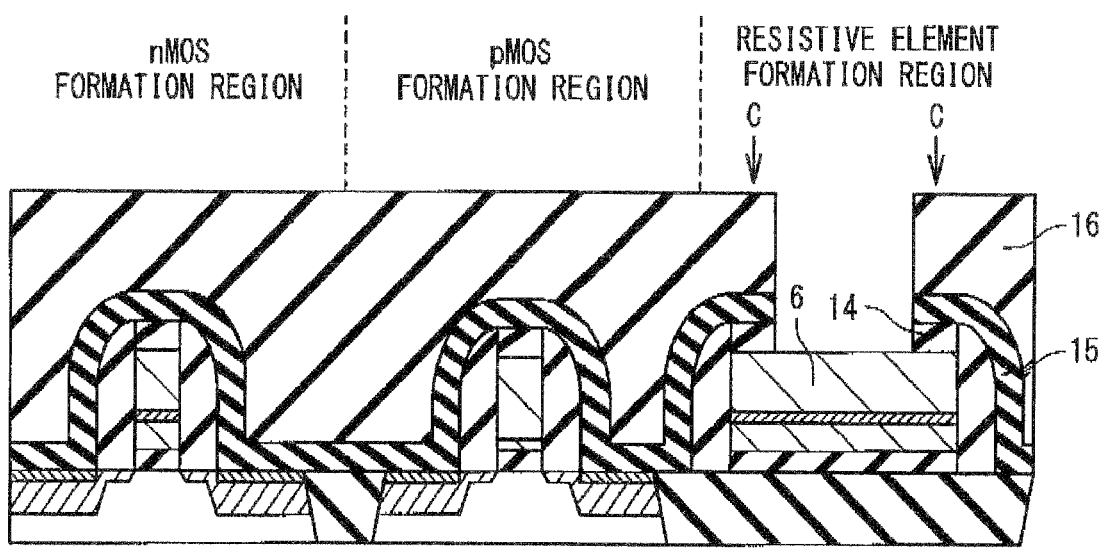

Next, as shown in FIG. 6E, a SiN film as the stress liner film 15 is blanket deposited by the plasma CVD method. The stress liner film 15 is formed for the purpose of applying stress to a channel region and being an etching stopper when the contact hole 11 is formed. A film thickness of the formed stress liner film 15 is 40 nm. Furthermore, the stress liner film 15 and the hard mask 14 are removed through the lithography using the resist 16 as a mask, such that the second metal film 6 in the resistive element formation region is exposed. At this time, the contact hole formation region C is kept covered by the hard mask 14 and the stress liner film 15.

Figure 6F:
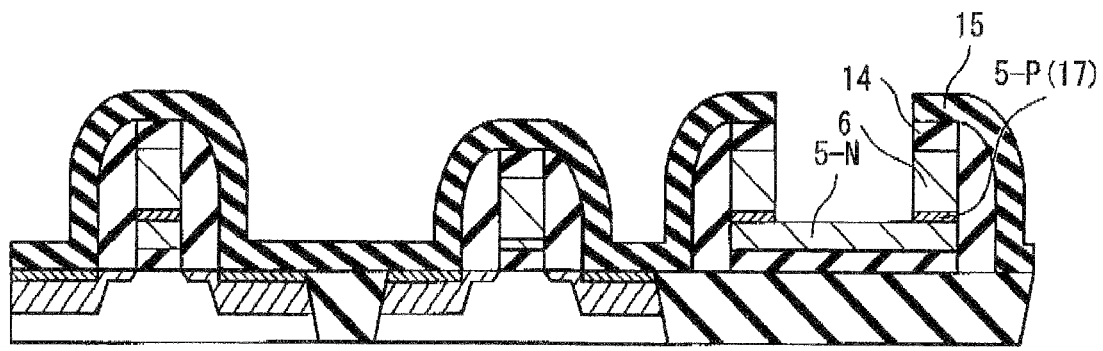

Next, as shown in FIG. 6F, the resist 16 is removed. After that, the second metal film 6 (W) is removed by the reactive ion etching (RIE) with using the SiN layer (hard mask 14 and stress liner film 15) as a mask. The reactive ion etching is performed by using $SF_6$ gas. At this time, the TiN film (first metal film 5-P, barrier layer 17) may be over-etched. Note here that the etching selectivity (W/TiN) can be set to about 10 by controlling the etching condition at the time of the etching of the second metal film 6. In the present example, the over etching of 50% is performed at the time of the etching of the second metal film 6. The amount for which the TiN film (5-P, 17) is etched due to the over etching is about 4 nm (=80 nm*50%/10). Whereas, in the resistive element formation region, the contact hole formation region C is covered by the SiN film (stress liner film 15 and hard mask 14) and thus the second metal film 6 is left unetched. Further, the exposed TiN film (5-P, 17) is removed by dry etching.

The dry etching with respect to the TiN film (5-P, 17) is performed by using halogen-based etching gas. Here, the etching selectivity of the TiN film (5-P, 17) with respect to the TaSiN film (first metal film 5-N) can be set to about 3 by controlling the etching gas and power. Let us consider a case where a thickness of the remaining TiN film (5-P, 17) is 6 nm to the maximum and the over etching of 100% is performed. In other words, the TiN film (5-P, 17) is etched under a condition that the TiN film (5-P, 17) is etched for about 12 nm. In this case, the film thinning amount of the first metal film 5-N (TasiN) as a base layer is 2 nm (=6 nm*100%/3). The film thickness of the first metal film 5-N is 20 nm, and thus the film thinning amount is about 10%. It is thus confirmed that the variation in the resistance value of the resistive element can be suppressed to a very narrow range. In the present example, the resistivity of the first metal film 5-N (TaSiN) is about 400 μΩcm. The sheet resistance of the first metal film 5-N (TaSiN) after the second metal film 6 (W) and the TiN film (5-P, 17) are etched is 215±20 Ω/square. Thus, the first metal film 5-N can sufficiently function as the resistive element.

As a comparative example, let us consider a case where the first metal film 5-N is not provided in the resistive element formation region and the resistive element section 8 is a stacked film of the TiN film (5-P, 17) and the second metal film 6. In this case, the TiN film (5-P, 17) with the thickness of 10 nm is etched for about 4 nm at the time of the etching of the second metal film 6. This causes remarkable variation in the film thickness and thus the resistance value.

Figure 6G:
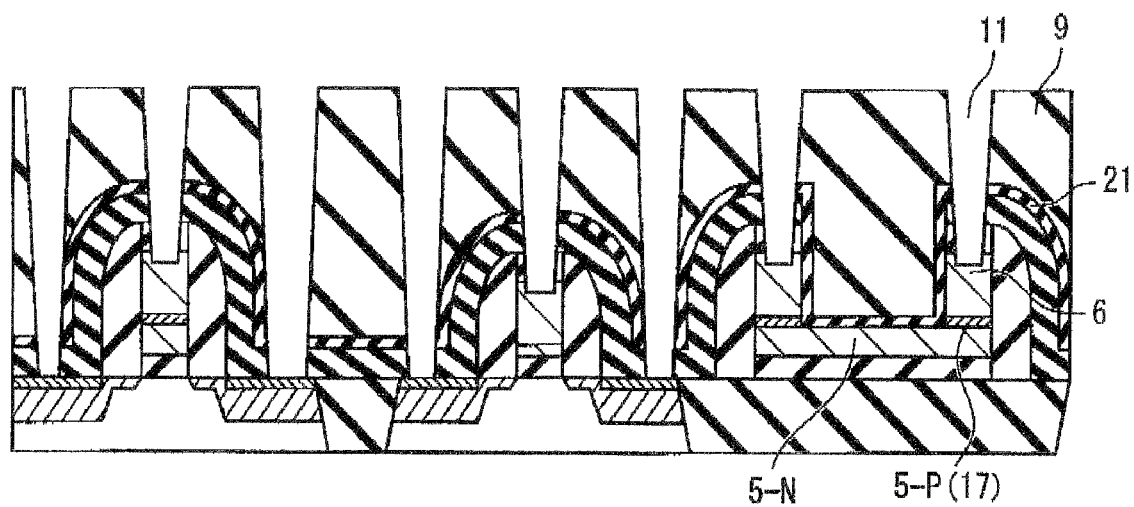

Next, as shown in FIG. 6G, a $SiO_2$ film having a thickness of 300 nm as the interlayer insulating film 9 is blanket deposited by the CVD method. As a result, a section from which the second metal film 6 is removed within the resistive element formation region is filled in with the interlayer insulating film 9. Here, a thin additional protection film 21 may be formed before depositing the interlayer insulating film 9 ($SiO_2$), in order to prevent oxidation of the exposed first metal film 5-N (TaSiN). In the present example, a SiN film having a thickness of 10 nm is formed as the additional protection film 21. After the interlayer insulating film 9 is deposited, a surface of the interlayer insulating film 9 is planarized by the COMP method. Furthermore, the RIE is performed for forming the group of contact holes 11.

In the gate electrode formation region and the resistive element formation region, the stress liner film 15 (SiN; 50 nm) and the hard mask 14 (SiN; 30 nm) exist under the interlayer insulating film 9 in the contact hole formation region. On the other hand, only the stress liner film 15 (SiN; 50 nm) exists and the hard mask 14 does not exist in the contact hole formation region on the source/drain region 3 (silicide layer 13). Therefore, in the region of the contact hole 11 leading to the source/drain region 3, an over etching is performed for about a thickness of the hard mask 14. However, a film thickness of the interlayer insulating film 9 on the source/drain region 3 is larger than a film thickness of the interlayer insulating film 9 on the gate electrode 7 and the resistive element section 8 by about a thickness of the gate electrode 7 and the hard mask 14. Therefore, an excessive over etching is not applied on the silicide layer 13 on the source/drain region 3.

In the contact hole formation region in the resistive element formation region, the resistive element section 8 has the stacked structure including the first metal film 5-N (TaSiN), the first metal film 5-P (TiN) and the second metal film 6 (W). The thickness of the second metal film 6 is 80 nm, which is sufficient. Therefore, even if the second metal film 6 is slightly etched due to the over etching at the time of the etching of the SiN layer (stress liner film 15, hard mask 14), the film thinning of the second metal film 6 does not affect the resistance value of the resistive element section 8 as a whole.

As a comparative example, let us consider a case where the second metal film 6 is not provided in the contact hole formation region C within the resistive element formation region and the resistive element section 8 is a stacked film consisting of the first metal film 5-N (TaSiN) and the TiN film (5-P, 17). The SiN layer (stress liner film 15, hard mask 14) is etched by, for example, halogen-based gas including $CH_3F_2$. The TiN film (5-P, 17) and the first metal film 5N (TaSiN) are easily etched by the halogen-based gas. Therefore, there is possibility that the stacked film of the first metal film 5-N (TaSiN) and the TiN film (5-P, 17) is completely removed or becomes very thin due to the over etching at the time of the etching of the SiN layer (stress liner film 15, hard mask 14), which causes increase in the contact resistance.

As described above, according to the present example, the resistive element section 8 under the contact hole 11 has the stacked structure of the second metal film 6 (W), the TiN film (5-P, 17) and the first metal film 5-N (TaSiN). Consequently, it is possible to suppress the increase in the contact resistance caused by the over etching at the time when the contact hole 11 is formed. Moreover, the resistive element section 8 in a region other than the contact hole formation region does not have the second metal film 6. It is thus possible by thinning the first metal film 5 to achieve the resistance value required for the resistive element section 8, even though the metal film is used.

Furthermore, in the present example, the barrier layer 17 is provided between the second metal film 6 and the first metal film 5-N. Therefore, the second metal film 6 can be selectively etched, even in a case where the selective etching of the second metal film 6 with respect to the first metal film 5-N is difficult in term's of material.

Third Example

In the third example, the formation order of the first metal film 5-N and the first metal film 5-P is exchanged as compared with the foregoing second example. The other features are similar to those in the second example. In the present example, the first metal film 5-N on the NMOS transistor side is a TaSiN film, and the first metal film 5-P on the PMOS transistor side is a WN film. The barrier layer 17 is a TiN film. The second metal film 6 is a W film. The first metal film 5 in the resistive element section 8 is a TaSiN film, which is the same as the first metal film 5-N as in the case of the second example.

FIGS. 7A to 7G are cross-sectional views showing manufacturing processes of the semiconductor device according to the third example.

Figure 7A:
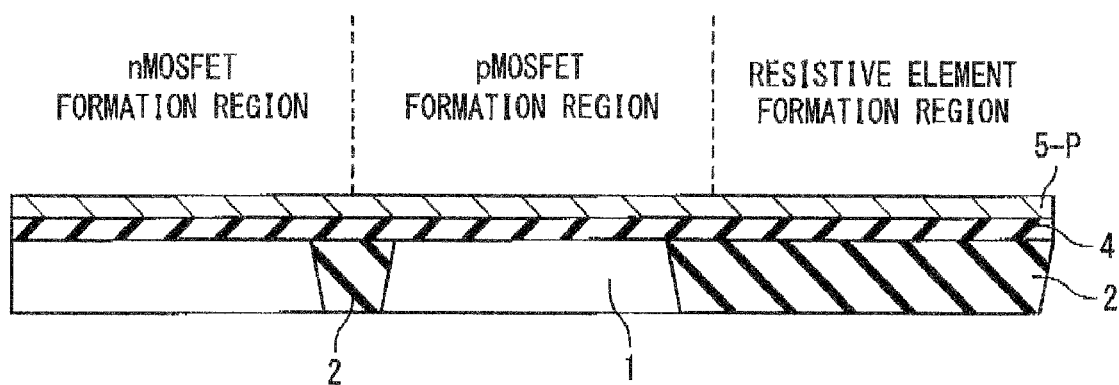
FIGS. 7A to 7G are cross-sectional views showing manufacturing processes of a semiconductor device according to a third example.

As shown in FIG. 7A, diffusion layers, the STI 2 and the gate insulating film 4 are formed in accordance with the well-known CMOS fabrication process. The gate insulating film 4 is a HfSiON film. A SiON film, a high-k film including Hf and the like are also possible for the gate insulating film 4.

After that, a WN film is formed as the first metal film 5-P. The first metal film 5-P is formed by the reactive sputtering method using W target in nitrogen atmosphere. A film thickness of the formed first metal film 5-P is 10 nm.

Figure 7B:
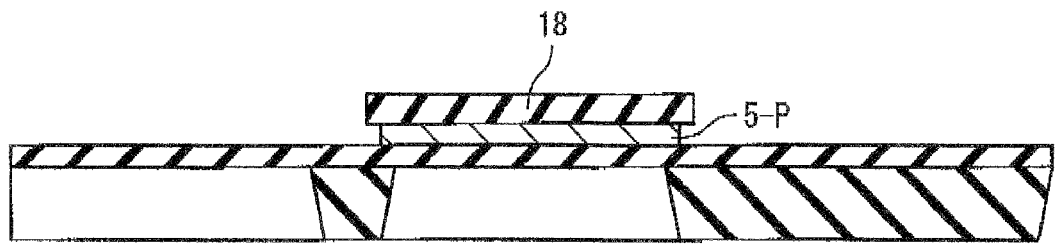

Next, as shown in FIG. 7B, an amorphous silicon (a-Si) layer as a hard mask 18 is formed on the first metal film 5-P through the lithography process. The hard mask 18 is formed in the PMOS formation region. Further, the first metal film 5-P is wet-etched while protecting the PMOS formation region by the hard mask 18. The first metal film 5-P is wet-etched by the use of hydrofluoric-acid-based etching solution.

Figure 7C:
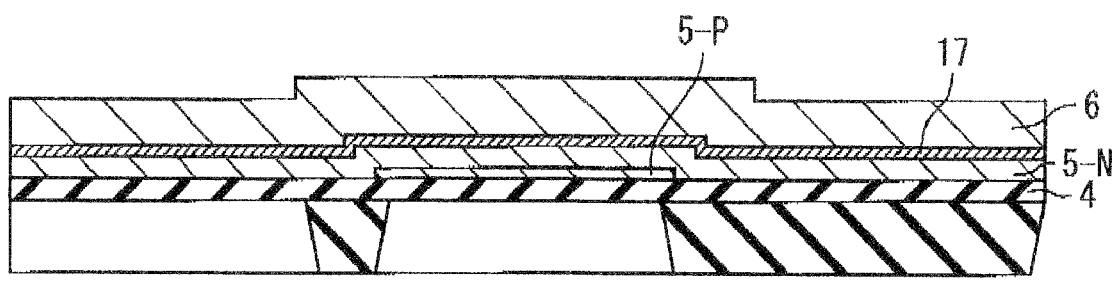

Next, as shown in FIG. 7C, the hard mask is is selectively removed by wet etching. Subsequently, the first metal film 5-N (TaSiN film) having a film thickness of 20 nm is blanket deposited. The first metal film 5-N is formed by the reactive sputtering method using TaSiN target in nitrogen atmosphere. Furthermore, the barrier layer 17 (TiN film) having a film thickness of 10 nm is blanket deposited. The barrier layer 17 is formed by the reactive sputtering method using Ti target in nitrogen atmosphere. After that, a W film as the second metal film 6 is formed on the barrier layer 17 by the CVD method. A film thickness of the formed second metal film 6 is 80 nm.

Consequently, in the PMOS formation region, the first metal film 5-P, the first metal film 5-N, the barrier layer 17 and the second metal film 6 are stacked in this order on the gate insulating film 4. Whereas, in the NMOS formation region and the resistive element formation region, the first metal film 5-N, the barrier layer 17 and the second metal film 6 are stacked in this order on the gate insulating film 4.

Figure 7D:
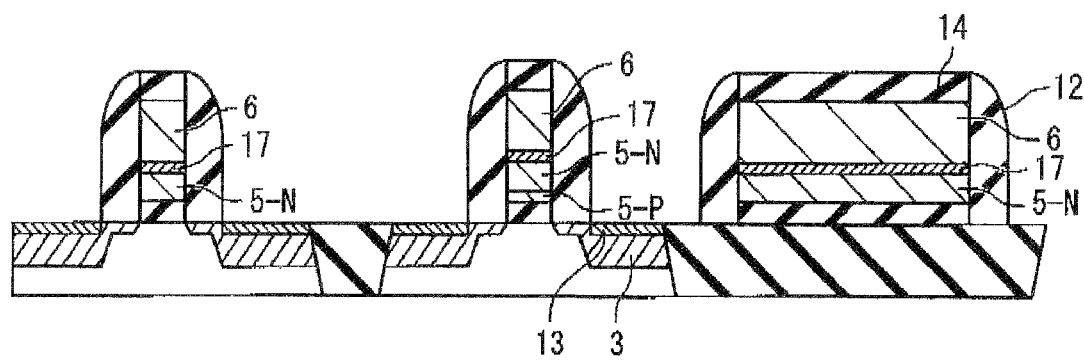
Figure 7E:
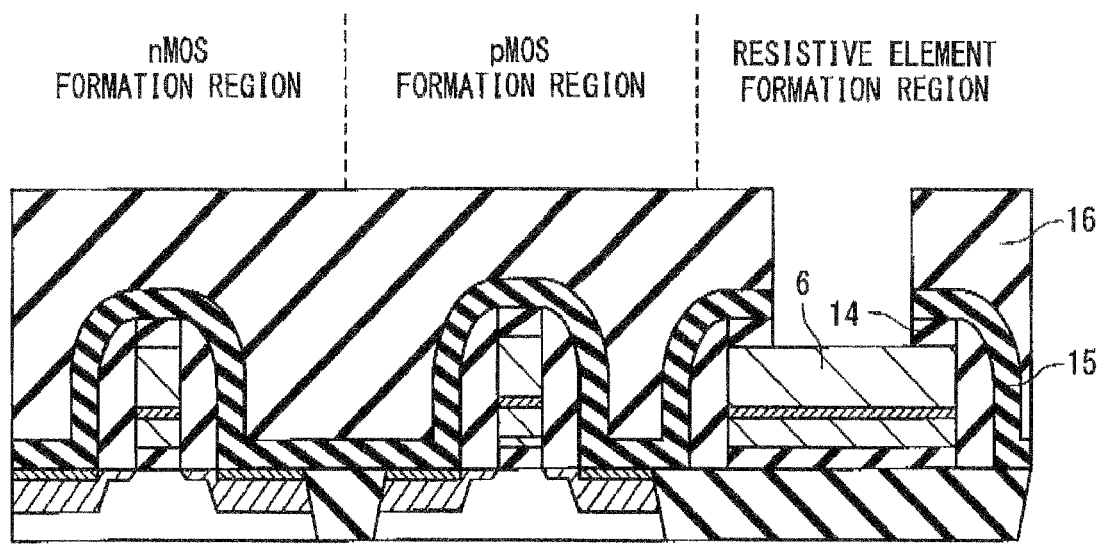
Figure 7F:
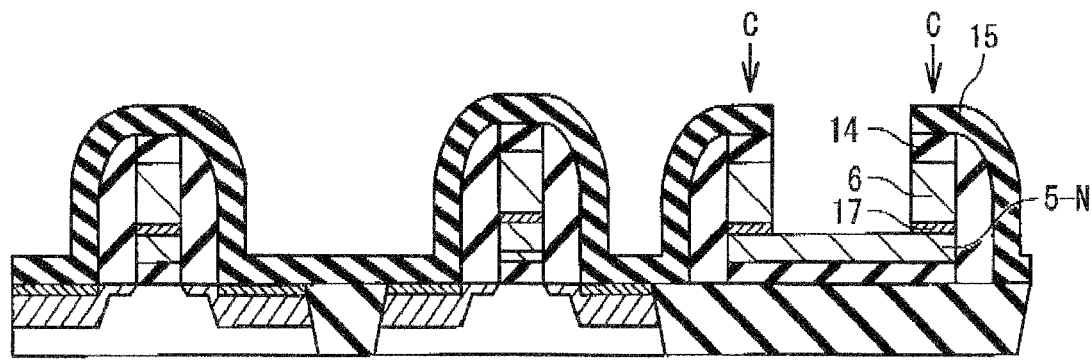
Figure 7G:
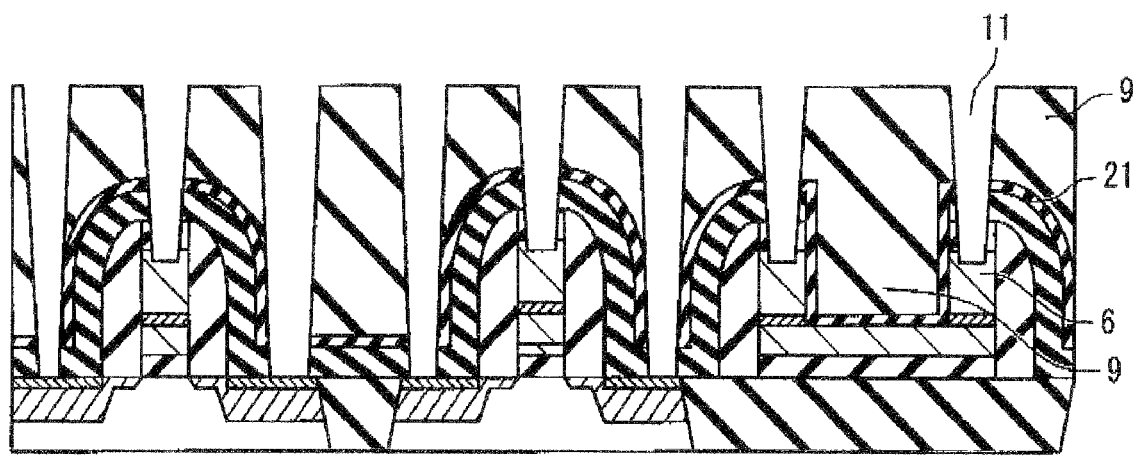

The subsequent processes are similar to those in the second example. As shown in FIG. 7D, the stacked film formed on the gate insulating film 4 is patterned such that the gate electrode 7 and the resistive element section 8 are formed. Next, as shown in FIG. 7E, the SiN film (hard mask 14, stress liner film 15) is formed, and then the second metal film 6 in the resistive element formation region is exposed through the lithography process. Next, as shown in FIG. 7F, the second metal film 6 and the barrier layer 17 in the resistive element formation region are removed. At this time, the second metal film 6 in the contact hole formation region C within the resistive element formation region is left unremoved. Next, as shown in FIG. 7G, the interlayer insulating film 9 is formed and then the contact holes 11 are formed in the interlayer insulating film 9. The wiring layer is so formed on the interlayer insulating film 9 to fill in the contact holes 11. Consequently, the semiconductor device according to the present example is manufactured.

According to the present example, as described above, the barrier layer 17 (TiN) and the first metal film 5-P (WN) are formed of different materials. Even in this case, the same effects as in the foregoing examples can be obtained.

Fourth Example

In the foregoing examples, the first metal film 5 in the NMOS formation region or the PMOS formation region has a stacked structure of the first metal film 5-N and the first metal film 5-P. According to the present example, a single-layer first metal film 5 is formed in each of the NMOS formation region and the PMOS formation region.

In the present example, the first metal film 5-N on the NMOS transistor side is a TaSiN film, and the first metal film 5-P on the PMOS transistor side is a WN film. The barrier layer 17 is a TiN film. The second metal film 6 is a w film. The first metal film 5 in the resistive element section 8 is a TaSiN film, which is the same as the first metal film 5-N (TaSiN film) as in the case of the second example.

FIGS. 8A to 8E are cross-sectional views showing manufacturing processes of the semiconductor device according to the fourth example.

As shown in FIG. 5A, diffusion layers, the STI 2 and the gate insulating film 4 are formed as in the second example. After that, the first metal film 5-P (WN film) is formed as in the second example. Then, the first metal film 5-P is left only in the PMOS formation region by using a hard mask 18-1 formed of a-Si.

Figure 8A:
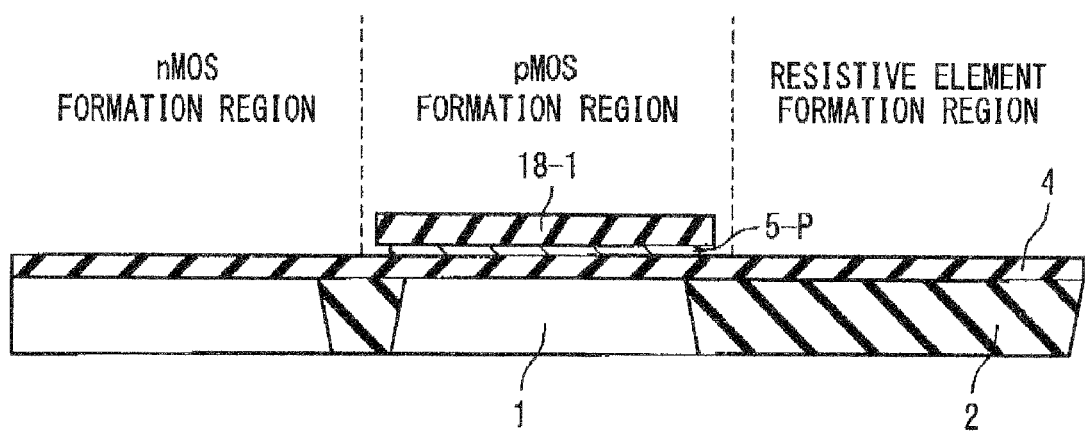
FIGS. 8A to 8E are cross-sectional views showing manufacturing processes of a semiconductor device according to a fourth example.
Figure 8B:
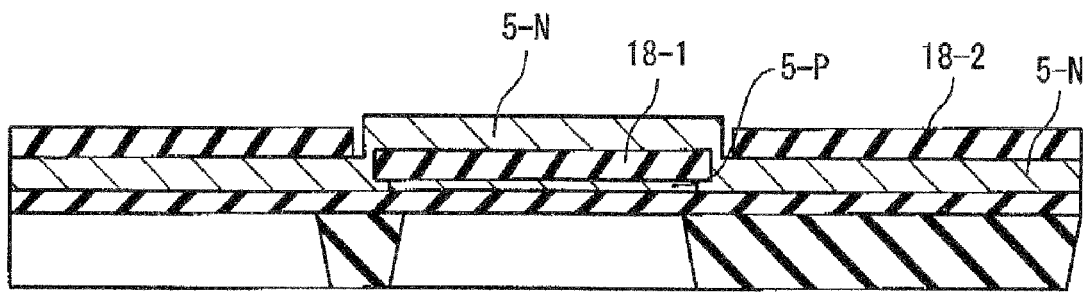

Next, as shown in FIG. 8B, the first metal film 5-N (TaSiN film) is blanket deposited with the hard mask 18-1 remained. Then, a hard mask 18-2 of a-Si is formed such that only the NMOS formation region and the resistive element formation region are protected.

Figure 8C:
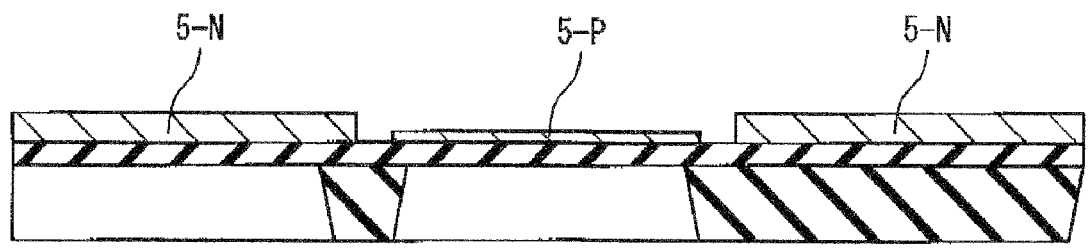

Next, the hard mask 18-2 is used as a mask and the first metal film 5-N (TaSiN) is wet-etched by the use of ammonia-hydrogen peroxide solution. At this time, the foregoing first metal film 5-P (WN film) is protected by the hard mask 18-1. Therefore, the first metal film 5-P is not etched by the ammonia-hydrogen peroxide solution, except for a slight side etching. After that, as shown in FIG. 5C, the hard masks 18-1 and 18-2 are removed by wet etching. As shown in FIG. 8C, the first metal film 5-N in the NMOS formation region and the first metal film 5-P in the PMOS formation region are spatially separated from each other.

Figure 8D:
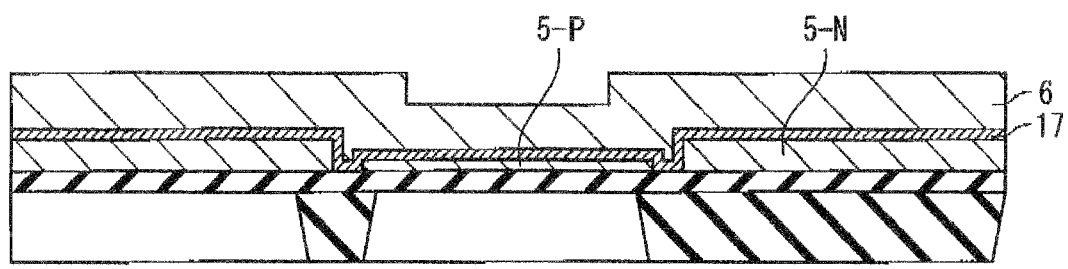

Next, as shown in FIG. 8D, the barrier layer 17 (TiN film) is blanket deposited. Furthermore, the second metal film 6 (W film) is blanket deposited.

Figure 8E:
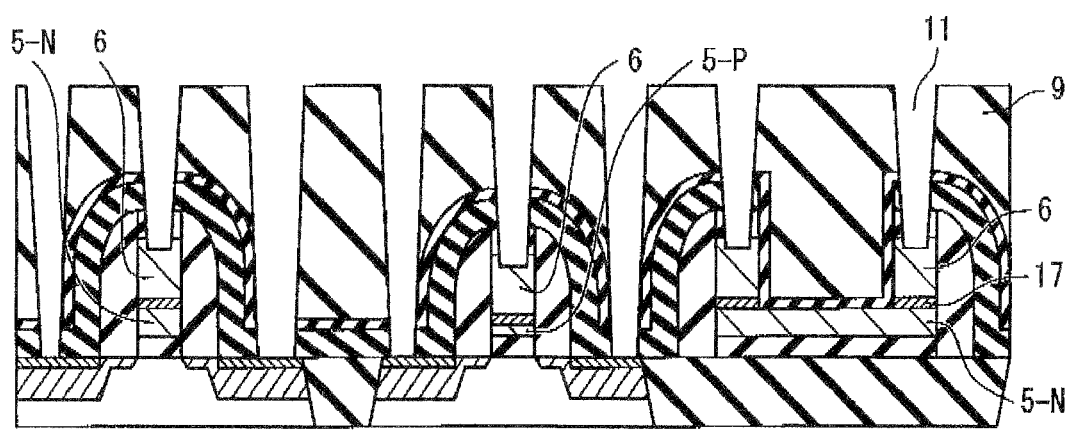

After that, the same processes as in the foregoing examples are performed. Consequently, the semiconductor device as shown in FIG. 8E is manufactured.

In the present example, the first metal film 5N and the first metal film 5-P are respectively patterned. Therefore, the number of the lithography processes is increased by one time as compared with the foregoing examples. Whereas, the first metal film 5 is formed to have the single-layer structure. Therefore, when the stacked film formed on the gate insulating film 4 is dry-etched to form the gate electrode 7 and the resistive element section 8, the film thickness amount to be etched becomes smaller. As a result, the difficulty level of the dry etching process is decreased.

Moreover, if the semiconductor device has a structure in which the gate electrode 7 in the NMOS formation region and the gate electrode 7 in the PMOS formation region are shared, interdiffusion of the first metal film 5 between the NMOS formation region and the PMOS formation region is a concern. Whereas, according to the present example, the first metal film 5-N in the NMOS formation region and the first metal film 5-P in the PMOS formation region are spatially separated from each other, which can prevent the interdiffusion of the first metal film 5.

FIG. 9 is an explanatory diagram for explaining the present example. The row (a) in FIG. 9 is a plan view showing an arrangement of the NMOS formation region, PMOS formation region and gate electrode. The row (b) in FIG. 9 shows the cross-sectional structure of the semiconductor device in the present example. The row (c) in FIG. 9 shows the cross-sectional structure of the semiconductor device in the foregoing third example, which is illustrated for comparison.

As shown in the row (b) the first metal film 5-N and the first metal film 5-P are spatially separated from each other according to the present example. The gate electrode 7 in the NMOS formation region and the gate electrode 7 in the PMOS formation region are electrically connected with each other through the barrier layer 17 and the second metal film 6 formed thereafter.

When a TaN film or a TiN film is used as the barrier layer 17, the interdiffusion of constituent element between the NMOS formation region and the PMOS formation region is prevented effectively, which enables precise control of the threshold voltage.

On the other hand, in the case of the foregoing third example as shown in the row (c), the first metal film 5-P and the first metal film 5-N are in contact with each other at a n/p boundary 22 between the NMOS formation region and the PMOS formation region. Therefore, the interdiffusion may occur during impurity activation process, depending on the material of the first metal film 5. This can cause change in an effective work function and hence variation in the threshold voltage of the transistor.

Figure 10A:
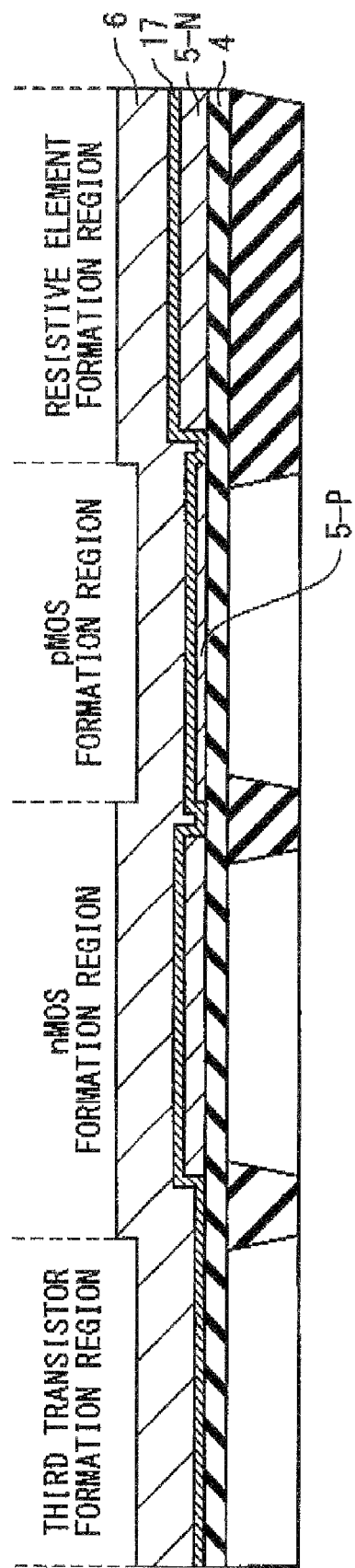
FIGS. 10A and 10B are cross-sectional views showing manufacturing processes according to a modified example of the fourth example.
Figure 10B:
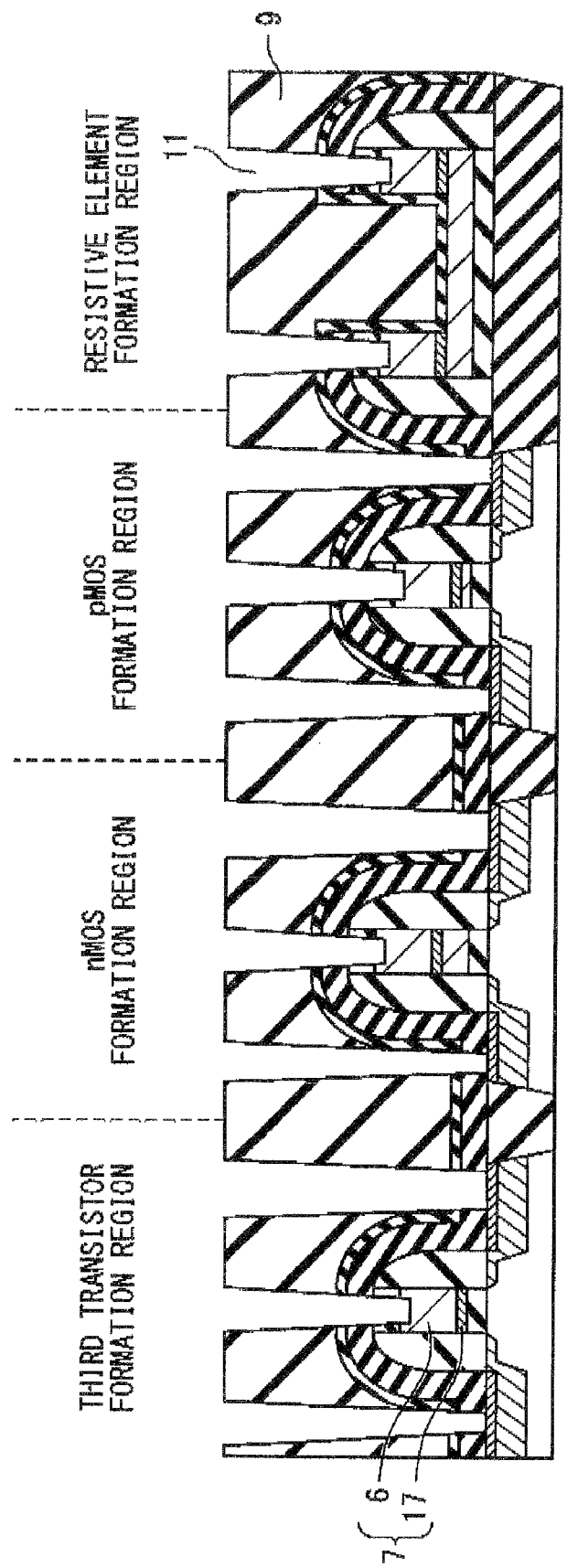

Next, a modified example of the present example will be described below. FIGS. 10A and 10B are cross-sectional views showing manufacturing processes according to the modified example.

As shown in FIG. 10A, a third transistor formation region is provided separately from the NMOS formation region and the PMOS formation region. A third transistor is formed in the third transistor formation region. In the third transistor formation region, both of the first metal film 5-N and the first metal film 5-P are removed by etching. In the third transistor formation region, only the barrier layer 17 (third metal film) is formed between the gate insulating film 4 and the second metal film 6.

After that, as shown in FIG. 10B, the transistors are formed. In the third transistor formation region, the gate electrode 7 of the third transistor is formed of the barrier layer 17 and the second metal film 6.

In this manner, according to the present modified example, the third transistor can be formed without adding new process. For example, when TaN having a work function of mid gap is selected as the barrier layer 17, the third transistor having a comparatively high threshold voltage (Vth) of about 0.5 to 0.6 V can be formed. As a result, element fabrication option is enlarged.

The present invention is not limited to the above-described examples. For example, the material of the gate electrode 7 on the PMOS side can be Ru, Pt and the like. The material of the gate electrode 7 on the NMOS side can be TaN, TaC, HfC and the like. The material of the barrier layer 17 can be TaSiN, TaN and the like. Not only the W film but also a Mo film can be used as the second metal film 6. The wet etching solution and the dry etching gas used in the etching are appropriately selected depending on the material to be used.

It is apparent that the present invention is not limited to the above embodiments and may be modified and changed without departing from the scope and spirit of the invention.

What is claimed is:

1. A method of manufacturing a semiconductor device, comprising:
   forming a gate insulating film on a substrate;
   forming a first metal film on said gate insulating film;
   forming a second metal film on said first metal film;
   patterning a stacked film of said first and second metal films such that said stacked film is left in a gate electrode formation region and a resistive element formation region, wherein a gate electrode of a transistor is formed in said gate electrode formation region and a resistive element section is formed in said resistive element formation region;
   setting a contact hole formation region within each of said gate electrode formation region and said resistive element formation region;
   removing said second metal film in said resistive element formation region with protecting said contact hole formation region;
   forming an interlayer insulating film so as to cover said stacked film, after said removing said second metal film; and
   removing said interlayer insulating film formed in said contact hole formation region to form a contact hole leading to said second metal film in said contact hole formation region.

2. The method according to claim 1, further comprising: forming a conductive etching sacrifice layer on said first metal film after said forming said first metal film and before said forming said second metal film,
   wherein said second metal film is formed on said first metal film through said conductive etching sacrifice layer.

3. The method according to claim 1, further comprising: blanket depositing a stress liner layer after said forming said second metal film and before said patterning.

4. The method according to claim 1,
   wherein in said setting said contact hole formation region, an entire region where said contact hole is potentially formed is set as said contact hole formation region,
   wherein the entire region where said contact hole is potentially formed includes displacement and variation of a location of said contact hole as a margin.

5. The method according to claim 1,
   wherein said first metal film is a TaSiN film.

6. The method according to claim 1,
   wherein said second metal film is a W film.

7. The method according to claim 1,
   wherein said first metal film comprises:
   a first type first metal film that is at least used as a gate electrode of a first conductivity type transistor; and
   a second type first metal film that is at least used as a gate electrode of a second conductivity type transistor,
   wherein said forming said first metal film comprises:
   forming said first type first metal film on said gate insulating film; and
   forming said second type first metal film after said forming said first type first metal film.

8. The method according to claim 7,
   wherein said forming said first metal film further comprises: removing said first type first metal film in said resistive element formation region.

9. The method according to claim 7,
   wherein said removing said second metal film in said resistive element formation region with protecting said contact hole formation region comprises: etching said second metal film by using said second type first metal film as an etching sacrifice layer.

10. The method according to claim 7,
    wherein said forming said first metal film further comprises:
    removing said first type first metal film that is formed in a second conductivity type transistor formation region where said second conductivity type transistor is formed; and
    removing said second type first metal film that is formed in a first conductivity type transistor formation region where said first conductivity type transistor is formed.

11. The method according to claim 10,
wherein said first type first metal film and said second type first metal film are removed such that said first type first metal film in said first conductivity type transistor formation region and said second type first metal film in said second conductivity type transistor formation region are separated from each other.

12. The method according to claim 7, further comprising: forming a third metal film after said forming said first metal film, said third metal film being used as a gate electrode of a third transistor different from said first conductivity type transistor and said second conductivity type transistor,
wherein said removing said second metal film in said resistive element formation region with protecting said contact hole formation region comprises: etching said second metal film by using said third metal film as an etching sacrifice layer.

* * * * *